(12) United States Patent
Zerbe et al.

(10) Patent No.: US 9,565,036 B2
(45) Date of Patent: Feb. 7, 2017

(54) TECHNIQUES FOR ADJUSTING CLOCK SIGNALS TO COMPENSATE FOR NOISE

(75) Inventors: Jared Zerbe, Woodside, CA (US); Pradeep Batra, Santa Clara, CA (US); Brian Leibowitz, San Francisco, CA (US)

(73) Assignee: Rambus Inc., Sunnyvale, CA (US)

( * ) Notice: Subject to any disclaimer, the term of this patent is extended or adjusted under 35 U.S.C. 154(b) by 498 days.

(21) Appl. No.: 13/378,024

(22) PCT Filed: May 31, 2010

(86) PCT No.: PCT/US2010/036792
§ 371 (c)(1),
(2), (4) Date: Dec. 13, 2011

(87) PCT Pub. No.: WO2011/008356
PCT Pub. Date: Jan. 20, 2011

(65) Prior Publication Data
US 2012/0087452 A1 Apr. 12, 2012

Related U.S. Application Data

(60) Provisional application No. 61/221,863, filed on Jun. 30, 2009, provisional application No. 61/321,231, filed on Apr. 6, 2010.

(51) Int. Cl.
*H04L 7/00* (2006.01)
*H04L 25/00* (2006.01)
(Continued)

(52) U.S. Cl.
CPC ............. *H04L 25/0264* (2013.01); *G06F 1/10* (2013.01); *H03K 5/1252* (2013.01)

(58) Field of Classification Search
CPC .... G06F 13/1689; G06F 1/10; G11C 11/4076; G11C 11/4096; G11C 2207/2254; C11C 7/04; H04L 25/0266; H04L 7/033; H04L 25/06; H04L 5/023; H04L 27/04; H04L 7/0337; H04L 7/0338; H04M 11/06; H04B 1/04; G01S 1/68; G01S 7/282; H03B 5/34; H03L 7/0814
(Continued)

(56) References Cited

U.S. PATENT DOCUMENTS 5,614,855 A * 3/1997 Lee ........................ H03L 7/0812
327/156
5,623,644 A * 4/1997 Self ................... G06F 15/17381
709/234
(Continued)

FOREIGN PATENT DOCUMENTS

CN 101034152 A 9/2007
CN 101207472 A 6/2008
(Continued)

OTHER PUBLICATIONS

PCT International Search report and the Written Opinion with mail date of Jan. 19, 2011 re Int'l. No. PCT/US2010/036792. 11 Pages.
(Continued)

*Primary Examiner* — James M Perez
(74) *Attorney, Agent, or Firm* — Lance Kreisman; Peninsula Patent Group

(57) ABSTRACT

A first integrated circuit (IC) has an adjustable delay circuit and a first interface circuit. A first clock signal is provided to the adjustable delay circuit to produce a delayed clock signal provided to the first interface circuit. A second IC has a supply voltage sense circuit and a second interface circuit that transfers data with the first IC. The supply voltage sense circuit provides a noise signal to the first IC that is indicative of noise in a supply voltage of the second IC. The adjustable delay circuit adjusts a delay of the delayed clock signal based on the noise signal. In other embodiments, edge-
(Continued)

colored clock signals reduce the effects of high frequency jitter in the transmission of data between integrated circuits (ICs) by making the high frequency jitter common between the ICs. In other embodiments, a supply voltage is used to generate clocks signals on multiple ICs.

26 Claims, 18 Drawing Sheets

(51) Int. Cl.
*H04L 25/40* (2006.01)
*H04L 25/02* (2006.01)
*G06F 1/10* (2006.01)
*H03K 5/1252* (2006.01)

(58) Field of Classification Search
USPC .................................. 375/219–236, 257–376
See application file for complete search history.

(56) References Cited

U.S. PATENT DOCUMENTS

| | | | | |
|---|---|---|---|---|
| 5,708,686 | A * | 1/1998 | Assmus | H04J 3/0632 365/189.04 |
| 6,047,346 | A * | 4/2000 | Lau | G06F 13/4072 327/158 |
| 6,125,157 | A * | 9/2000 | Donnelly | G06F 1/10 327/141 |
| 6,140,854 | A * | 10/2000 | Coddington | G06F 1/10 327/149 |
| 6,204,690 | B1 | 3/2001 | Young et al. | |
| 6,243,821 | B1 * | 6/2001 | Reneris | G06F 1/189 713/323 |
| 6,301,184 | B1 * | 10/2001 | Sasaki | G11C 7/1045 365/226 |
| 6,317,465 | B1 * | 11/2001 | Akamatsu | H04L 25/0272 375/257 |
| 6,542,096 | B2 | 4/2003 | Yap et al. | |
| 6,643,787 | B1 * | 11/2003 | Zerbe | G06F 1/10 710/104 |
| RE38,482 | E * | 3/2004 | Leung | H03K 3/0231 327/154 |
| 6,701,506 | B1 | 3/2004 | Srinivasan et al. | |
| 6,703,860 | B1 | 3/2004 | Agrawal et al. | |
| 6,754,877 | B1 | 6/2004 | Srinivasan | |
| 6,823,502 | B2 | 11/2004 | Wingren et al. | |
| 6,911,853 | B2 * | 6/2005 | Kizer | G06F 1/10 327/158 |
| 6,950,956 | B2 * | 9/2005 | Zerbe | G06F 1/10 327/141 |
| 7,058,150 | B2 | 6/2006 | Buchwald et al. | |
| 7,124,221 | B1 * | 10/2006 | Zerbe | H04L 25/03057 348/471 |
| 7,138,877 | B2 * | 11/2006 | Vu | H03L 7/0898 331/2 |
| 7,397,725 | B2 * | 7/2008 | Stark | G06F 13/4217 365/194 |
| 7,471,691 | B2 | 12/2008 | Black et al. | |
| 7,486,725 | B2 * | 2/2009 | Chen | H04B 17/0085 375/224 |
| 7,599,456 | B1 * | 10/2009 | Chi | H03F 3/217 370/232 |
| 7,606,341 | B2 * | 10/2009 | Pereira | H04L 7/0337 375/224 |
| 7,697,628 | B2 * | 4/2010 | Choi | H04L 25/085 341/55 |
| 7,826,551 | B2 * | 11/2010 | Lee | H04L 25/0272 327/64 |
| 7,839,194 | B2 * | 11/2010 | Chang | G06F 1/06 327/172 |
| 7,885,367 | B2 * | 2/2011 | Nishimura | H04L 7/048 327/144 |
| 7,986,745 | B2 * | 7/2011 | Hosaka | H03M 5/16 341/58 |
| 8,063,650 | B2 * | 11/2011 | Ong | G01R 31/31722 324/750.3 |
| 8,170,157 | B2 * | 5/2012 | Menolfi | H03L 7/07 327/291 |
| 8,198,930 | B2 * | 6/2012 | Zerbe | G06F 1/10 327/158 |
| 8,472,532 | B2 * | 6/2013 | Schley-May | H04B 3/02 375/257 |
| 8,472,551 | B2 * | 6/2013 | Wiley | H04L 5/20 341/58 |
| 8,836,394 | B2 * | 9/2014 | Zerbe | H04L 7/0079 326/82 |
| 8,989,249 | B2 * | 3/2015 | Zerbe | H04L 7/0079 375/229 |
| 2002/0176425 | A1 * | 11/2002 | Aoki | H04L 12/40032 370/395.4 |
| 2003/0014683 | A1 | 1/2003 | Deas | 713/503 |
| 2003/0053489 | A1 * | 3/2003 | Zerbe | G06F 1/12 370/503 |
| 2003/0081709 | A1 * | 5/2003 | Ngo | H03L 7/07 375/362 |
| 2003/0156462 | A1 * | 8/2003 | Lim | G11C 7/22 365/189.05 |
| 2003/0179613 | A1 * | 9/2003 | Iwamoto | G11C 7/1066 365/194 |
| 2003/0204757 | A1 * | 10/2003 | Flynn | G06F 1/24 713/310 |
| 2004/0057525 | A1 * | 3/2004 | Rajan | G06F 13/4072 375/257 |
| 2004/0070420 | A1 * | 4/2004 | Satou | G06F 1/3228 326/30 |
| 2004/0076192 | A1 * | 4/2004 | Zerbe | G06F 1/10 370/516 |
| 2004/0120437 | A1 * | 6/2004 | Casper | H03K 5/135 375/355 |
| 2004/0122490 | A1 * | 6/2004 | Reinke | A61N 1/025 607/60 |
| 2004/0184573 | A1 * | 9/2004 | Andersen | H03H 17/0621 375/372 |
| 2004/0236894 | A1 * | 11/2004 | Grundy | G06F 13/4022 711/1 |
| 2005/0013393 | A1 * | 1/2005 | Nishimura | H04L 7/041 375/354 |
| 2005/0169585 | A1 * | 8/2005 | Aronson | H04L 25/242 385/89 |
| 2006/0013331 | A1 * | 1/2006 | Choi | H04L 5/20 375/288 |
| 2006/0108972 | A1 * | 5/2006 | Araya | H01M 10/4207 320/106 |
| 2006/0208776 | A1 * | 9/2006 | Tonietto | H03L 7/0995 327/117 |
| 2006/0209944 | A1 * | 9/2006 | Carballo | H04B 17/24 375/227 |
| 2006/0220751 | A1 | 10/2006 | Nakashiba et al. | |
| 2007/0058768 | A1 * | 3/2007 | Werner | H03D 13/004 375/376 |
| 2007/0070669 | A1 * | 3/2007 | Tsern | G11C 5/02 365/51 |
| 2007/0086267 | A1 * | 4/2007 | Kwak | G11C 7/02 365/233.1 |
| 2007/0092011 | A1 * | 4/2007 | Ciccarelli | G06F 13/4077 375/257 |
| 2007/0096783 | A1 * | 5/2007 | de la Torre | H03L 7/08 327/156 |
| 2007/0153445 | A1 * | 7/2007 | O'Mahony | H03K 5/15013 361/600 |
| 2007/0164883 | A1 * | 7/2007 | Furtner | G06F 13/4295 341/126 |
| 2007/0273417 | A1 * | 11/2007 | Lin | G11C 7/22 327/158 |
| 2008/0056014 | A1 * | 3/2008 | Rajan | G06F 13/4243 365/189.03 |
| 2008/0068056 | A1 * | 3/2008 | Poulton | H03L 7/0812 327/156 |

(56) References Cited

U.S. PATENT DOCUMENTS

| | | | | |
|---|---|---|---|---|
| 2008/0080261 A1* | 4/2008 | Shaeffer | G11C 5/025 | 365/189.05 |
| 2008/0098277 A1* | 4/2008 | Hazelzet | H03M 13/19 | 714/753 |
| 2008/0159188 A1* | 7/2008 | Funagai | G06F 13/4286 | 370/298 |
| 2008/0162759 A1* | 7/2008 | Garlepp | G06F 13/1689 | 710/110 |
| 2008/0163007 A1* | 7/2008 | Shaeffer | G06F 11/1004 | 714/52 |
| 2008/0288818 A1* | 11/2008 | Lai | G06F 1/305 | 714/15 |
| 2009/0039927 A1* | 2/2009 | Gillingham | G06F 13/1694 | 327/156 |
| 2009/0243677 A1* | 10/2009 | Becker | G11C 7/22 | 327/158 |
| 2010/0066450 A1* | 3/2010 | Palmer | H03F 3/45179 | 330/261 |
| 2010/0073023 A1* | 3/2010 | Oh | G11C 7/1048 | 326/30 |
| 2010/0135100 A1* | 6/2010 | Chiu | G11C 7/1072 | 365/233.11 |
| 2010/0215118 A1* | 8/2010 | Ware | H03M 5/16 | 375/295 |
| 2010/0272215 A1* | 10/2010 | Lin | H04L 5/20 | 375/316 |
| 2010/0283532 A1* | 11/2010 | Horan | G09G 5/003 | 327/530 |
| 2011/0084737 A1* | 4/2011 | Oh | H04L 25/49 | 327/108 |
| 2011/0102043 A1* | 5/2011 | Zerbe | G06F 1/10 | 327/261 |
| 2011/0142112 A1* | 6/2011 | Lin | H04L 7/0008 | 375/224 |
| 2011/0235763 A1* | 9/2011 | Palmer | G11C 7/04 | 375/362 |
| 2011/0239031 A1* | 9/2011 | Ware | G11C 7/04 | 713/500 |
| 2011/0249718 A1* | 10/2011 | Zerbe | H03L 7/07 | 375/226 |
| 2011/0293041 A1* | 12/2011 | Luo | H04L 5/20 | 375/316 |
| 2011/0298508 A1* | 12/2011 | Wu | H04L 7/0337 | 327/157 |
| 2012/0087452 A1* | 4/2012 | Zerbe | H04L 25/0264 | 375/354 |
| 2012/0124258 A1* | 5/2012 | Tailliet | G06F 13/4295 | 710/106 |
| 2012/0311251 A1* | 12/2012 | Best | G06F 13/1689 | 711/105 |
| 2013/0007500 A1* | 1/2013 | Fiedler | G06F 1/10 | 713/501 |
| 2014/0195734 A1* | 7/2014 | Ha | G06F 1/3237 | 711/114 |

FOREIGN PATENT DOCUMENTS

| | | | | |
|---|---|---|---|---|
| EP | 0611053 A2 | 8/1994 | | H03K 19/0185 |
| JP | 09-326689 | 12/1997 | | H03L 7/00 |
| JP | 2004-185297 | 7/2004 | | G06F 1/04 |

OTHER PUBLICATIONS

CN Office Action dated Jan. 15, 2015 in CN Application No. 201080028508.2, Includes an English translation. 6 pages.

EP Office Communication dated Feb. 21, 2012 re EP Application No. 10800210.6. 2 pages.

EP Extended Search Report dated Jun. 23, 2015 in EP Application No. 10800210.6. 9 pages.

Smith et al., "Application-Specific Integrated Circuits," Copyright 1997, Addison Wesley Longman, Inc., pp. 853-899. 26 pages.

EP Partial Search Report dated Feb. 25, 2015 re Appln. No. 10800210.6. 5 pages.

EP Response with EP Appln. No. 10800210.6 filed on Jan. 19, 2016 in Response to the Extended European Search Report of Jun. 23, 2015 and the Communication Pursuant to Rules 70(2) and 70a(2) EPC of Jul. 10, 2015. 15 Pages.

* cited by examiner

TECHNIQUES FOR ADJUSTING CLOCK SIGNALS TO COMPENSATE FOR NOISE

CROSS REFERENCES TO RELATED APPLICATIONS

This patent application is a national stage application of international application number PCT/US2010/036792, filed May 31, 2010, which claims the benefit of U.S. provisional patent application 61/321,231, filed Apr. 6, 2010, and U.S. provisional patent application 61/221,863, filed Jun. 30, 2009, all of which are incorporated by reference herein in their entireties.

TECHNICAL FIELD

This disclosure relates to electronic circuits, and more particularly, to techniques for adjusting clock signals to compensate for noise.

BACKGROUND

Integrated circuit device clocking, such as the clock architectures in synchronous memory systems, provides a clock signal that is distributed to and throughout integrated circuit devices internally. As the clock signal is transmitted through clock buffers, the clock signal is affected by power supply noise on the power supply voltage received by the clock buffer. Power supply noise (PSN) can cause power supply induced jitter (PSIJ) in the clock signal as it is buffered. PSIJ in a clock signal that times the transmission of read data from a memory device may have an adverse effect when a controller device captures the read data with its clock signal.

DETAILED DESCRIPTION

Figure 1:
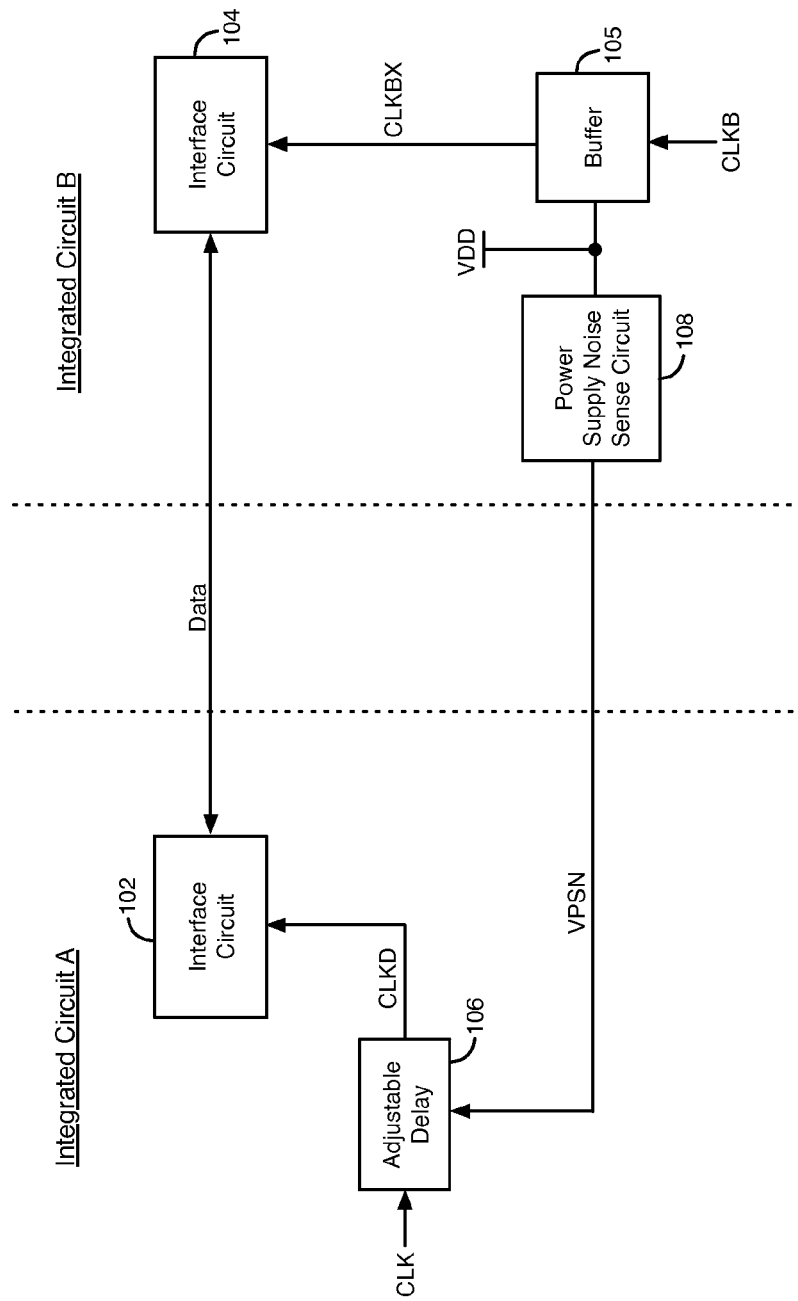
FIG. 1 illustrates an example system having a first integrated circuit that generates substantially matching power supply induced jitter (PSIJ) in a clock signal based on power supply noise (PSN) generated in a second integrated circuit.

According to embodiments described in more detail below, power supply noise information is transmitted to a first integrated circuit from a second integrated circuit. The power supply noise information is used to generate compensating power supply induced jitter (PSIJ) in a first clock signal on the first integrated circuit that tracks PSIJ in a second clock signal on the second integrated circuit to reduce the relative jitter between the two clock signals. The first clock signal clocks a first interface circuit, and the second clock signal clocks a second interface circuit.

According to an embodiment, a delay is added to a clock signal to cause a first integrated circuit to capture each bit in a data signal in response to the same clock edge (or a proximal clock edge in a sequence of clock edges) in the clock signal that is used to transmit the bit from a second integrated circuit. This embodiment provides edge-colored clock signals to reduce or eliminate the effects of high frequency jitter in the transmission of data between the first and second integrated circuits by making the high-frequency jitter common between the first and second integrated circuits.

In example embodiments presented herein, a system includes at least two integrated circuit (IC) devices. For example, a first IC device may be a memory controller that controls the operation of at least a second IC device, e.g., a synchronous integrated circuit memory device. The first device has an adjustable delay circuit. The adjustable delay circuit delays a first clock signal to provide a delayed clock signal to a first interface circuit in the first device. A second interface circuit in the second device transfers data with the first interface circuit in response to a third clock signal. A sense circuit in the second device provides a noise signal to the first device that varies based on power supply noise (PSN) in the second device. The adjustable delay circuit in the first device adjusts a delay of the delayed clock signal based on the noise signal to generate matching power supply induced jitter (PSIJ) in the delayed clock signal that correlates to the PSIJ a clock buffer in the second device generates in the third clock signal. Adjusting the delay of the delayed clock signal based on power supply noise in the second device causes the timing relationship between the data and the delayed clock signal used to clock the data to experience less relative clock jitter. It also allows the data to be transferred between the interface circuits at a higher data rate, because reducing relative jitter may provide for higher frequency clocking to be utilized before the data cannot be received at a low enough bit error rate.

According to other embodiments presented herein, power supply noise information is used to generate compensating power supply induced jitter (PSIJ) in a first clock signal on a first integrated circuit that tracks PSIJ in a second clock signal on a second integrated circuit to reduce the relative jitter between the two clock signals. A supply voltage having power supply noise is, for example, provided from the first integrated circuit to the second integrated circuit. Alternatively, a supply voltage having power supply noise is provided to the first and the second integrated circuits from an external source. The supply voltage is used to power a circuit that generates the first clock signal in the first integrated circuit. The supply voltage is also used to power a circuit that generates the second clock signal in the second integrated circuit. The first clock signal clocks a first interface circuit, and the second clock signal clocks a second interface circuit.

FIG. 1 illustrates an example system that generates a compensating PSIJ in a clock signal in a first integrated circuit based on power supply noise generated in a second integrated circuit. The system of FIG. 1 includes a first integrated circuit A and a second integrated circuit B. Integrated circuit A includes an interface circuit 102 and an adjustable delay circuit 106. Integrated circuit B includes an interface circuit 104, a clock buffer 105, and a power supply noise sense circuit 108.

Interface circuit 102 transfers data with interface circuit 104. For example, in an embodiment, interface circuit 102 includes a receiver circuit, and interface circuit 104 includes a transmitter circuit. For a bidirectional interface over a common set of signal lines, interface circuit 102 can also include a transmitter circuit, and interface circuit 104 can include a receiver circuit.

In this embodiment, clock buffer 105 drives a clock signal CLKB to interface circuit 104 as buffered clock signal CLKBX. Clock buffer 105 is powered from supply voltage VDD in integrated circuit B. Supply voltage VDD may have power supply noise that causes buffer 105 to induce power supply induced jitter (PSIJ) in CLKBX.

Power supply noise sense circuit 108 also receives supply voltage VDD in integrated circuit B. Power supply noise sense circuit 108 generates a noise signal VPSN that varies based on the power supply noise (PSN) in supply voltage VDD. Noise signal VPSN is transmitted to a control input of adjustable delay circuit 106.

Adjustable delay circuit 106 delays a clock signal CLK on integrated circuit A to generate a delayed clock signal CLKD that clocks interface circuit 102. Adjustable delay circuit 106 varies the delay provided to delayed clock signal CLKD based on variations in noise signal VPSN. Adjustable delay circuit 106 adjusts the delay of CLKD based on noise signal VPSN to generate power supply induced jitter (PSIJ) in CLKD that substantially matches the PSIJ clock buffer 105 generates in CLKBX. As a result, the PSN in integrated circuit B affects clock signals CLKD and CLKBX substantially in-common, which mitigates the impact of any PSIJ on CLKBX and the ability of interface circuit 102 to receive Data from integrated circuit B with PSIJ on it.

Figure 2:
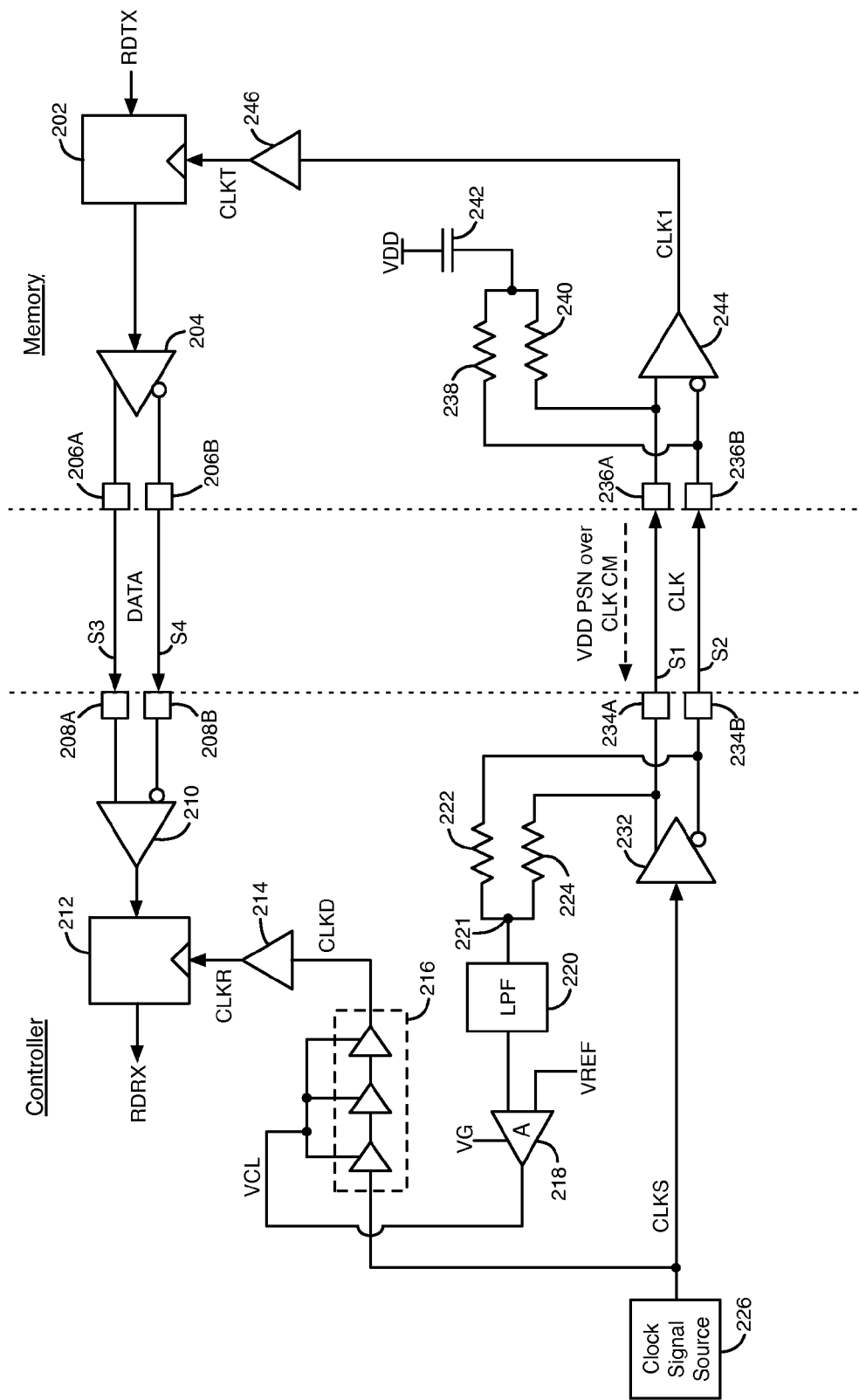
FIG. 2 illustrates an example system having a controller device that generates PSIJ in a receiver clock signal based on PSN generated in a memory device.

FIG. 2 illustrates an example system that generates a compensating PSIJ in a clock signal generated in a controller device based on power supply noise (PSN) information provided by a memory device. In one embodiment, the PSN information is transmitted from the memory device to the controller device via modulation of the common-mode voltage of a differential clock signal. The controller device adjusts a delay of the receiver clock signal based on PSN generated in the memory device. The controller device induces jitter in the receiver clock signal that substantially matches the PSIJ experienced by the transmit clock signal on the memory device within a frequency range without using extra pins. As a result, the system of FIG. 2 causes the timing between the data and the receiver clock signal to be closer to an ideal value despite the presence of power supply noise and PSIJ on the memory device.

In an embodiment, the system of FIG. 2 includes a controller integrated circuit (IC) device and a memory integrated circuit (IC) device. The memory IC device includes a transmitter timing circuit 202, a driver circuit 204, pins 206A-206B and 236A-236B, resistors 238 and 240, capacitor 242, receiver circuit 244, and clock buffer 246. The controller IC device includes timing circuit 212, receiver circuit 210, pins 208A-208B and 234A-234B, clock buffer 214, adjustable delay circuit 216, variable gain amplifier 218, low pass filter (LPF) 220, resistors 222 and 224, clock signal source 226, and driver circuit 232.

Clock signal source 226 generates a digital periodic clock signal CLKS that is transmitted to inputs of driver circuit 232 and adjustable delay circuit 216. In an embodiment, driver circuit 232 transmits the clock signal outside the controller IC through pins 234A-234B as a differential clock signal CLK. The differential clock signal CLK is then conveyed over external signal lines S1-S2 and received by the memory IC through pins 236A-236B. The memory IC includes receiver circuit 244 to receive the differential clock signal CLK using differential pins 236A-236B. Receiver circuit 244 generates an internal clock signal CLK1 that is provided to clock buffer 246 from the received differential clock signal CLK. Clock buffer 246 drives CLK1 to a clock input of transmitter timing circuit 202 as transmit clock signal CLKT. Clock buffer 246 generates PSIJ in CLKT that is caused by PSN in supply voltage VDD. The internal clock signal CLK1 may be distributed on the memory IC using differential lines or using a single ended approach.

In an embodiment, transmitter timing circuit 202 transmits a read data signal RDTX to an input of driver circuit 204 in response to clock signal CLKT. Driver circuit 204 drives the read data signal RDTX outside the memory IC through pins 206A-206B as a differential read data signal DATA. The read data signal DATA is then transmitted through external signal lines S3-S4 and is received by the controller IC through pins 208A-208B. In another embodiment, driver 204 provides the read data signal in a single ended manner, over a single signal line. For simplicity, signal lines S3 and S4 are depicted as being unidirectional in the present embodiment and may be architected as being bidirectional by incorporating both transmit and receive circuits on both the controller IC and the memory IC.

Receiver circuit 210 receives the read data signal DATA at pins 208A-208B. Receiver circuit 210 drives the read data signal to an input of timing circuit 212. Timing circuit 212 outputs the read data signal in response to receiver clock signal CLKR to generate a read data signal RDRX. Timing circuit 212 can be, for example, a flip-flop, a latch, or a sampler circuit.

Resistor 240 is coupled to pin 236A, and resistor 238 is coupled to pin 236B. Resistors 238 and 240 are AC-coupled to a supply voltage VDD in the memory IC through capacitor 242. Resistors 238 and 240 have the same resistance values. Supply voltage VDD is the same supply voltage that provides charge to receiver circuit 244 and clock buffer circuit 246. In alternate embodiments, other methods can be used to couple the supply voltage VDD to the common mode of the differential clock channel from the memory device such as use of a resistor divider network or other technique.

Capacitor 242 and resistors 238 and 240 are a sense circuit that senses the power supply noise in supply voltage VDD on the memory IC. In an embodiment, the sense circuit causes the power supply noise information of supply voltage VDD to be transmitted in a back channel technique via the common mode voltage of the differential clock signal CLK from pins 236A-236B to pins 234A-234B. The common mode voltage of differential clock signal CLK varies based on the power supply noise in supply voltage VDD.

In an embodiment, resistors 222 and 224 are an averaging circuit that averages the voltage signals at pins 234A and 234B to extract the common mode voltage $V_{CM,CLK}$ (of the differential clock signal CLK at an input of low pass filter 220 (i.e., at node 221). Resistors 222 and 224 have the same resistance values. Low pass filter 220 passes only the low frequency components of $V_{CM,CLK}$ as an output voltage signal to a first input of variable gain amplifier 218. As an example that is not intended to be limiting, low pass filter 220 can have a cutoff frequency of about 500 MHz. Low pass filter 220 filters out any high frequency components of the received power supply noise signal (e.g., from crosstalk).

Variable gain amplifier 218 amplifies the difference between the output voltage signal of low pass filter 220 and a reference voltage signal VREF to generate an output control voltage signal VCL. Amplifier 218 can compensate for any attenuation in the power supply noise that is present in $V_{CM,CLK}$. Amplifier 218 has a variable gain that is set based on a gain control signal VG.

The output control voltage signal VCL of amplifier 218 is transmitted to adjustable delay circuit 216. Adjustable delay circuit 216 can be, for example, a voltage-controlled delay line (VCDL). Adjustable delay circuit 216 delays clock signal CLKS to generate a delayed clock signal CLKD.

The delay that adjustable delay circuit 216 provides to CLKD relative to CLKS is a variable delay that is determined by control voltage signal VCL. Amplifier 218 adjusts VCL based on the low frequency components of $V_{CM,CLK}$ (and thus changes in VDD of the memory device. Changes in VCL cause delay circuit 216 to vary the delay provided to CLKD relative to CLKS. Clock buffer 214 drives CLKD to a clock input of circuit 212 as receiver clock signal CLKR.

By putting adjustable delay circuit 216 at the beginning of the clock buffer chain made up of buffer 214 and adjustable delay circuit 216, adjustable delay circuit 216 can be a relatively small delay line that consumes a small amount of power. Also, by keeping adjustable delay circuit 216 small in size, the regulator that is made up of amplifier 218 and adjustable delay circuit 216 can have a relatively high bandwidth.

In an embodiment, amplifier 218 and adjustable delay circuit 216 are adjusted to have a voltage-to-time transfer function that substantially matches the voltage-to-time transfer function of clock buffer 246. The voltage-to-time transfer function of clock buffer 246 refers to the PSIJ generated in CLKT in response to the PSN in VDD. The voltage-to-time transfer function of circuits 216 and 218 refers to the PSIJ generated in CLKD in response to the PSN in VDD. The transfer function of amplifier 218 and adjustable delay circuit 216 can be calibrated by directly observing the performance of different settings or by adjusting VDD explicitly and observing the relative time shift between CLKT and CLKR, and adjusting gain control voltage VG accordingly. For example, the time shift between CLKT and CLKR can be sensed by its impact on the nominal timing alignment of the memory device transmitter and the controller receiver.

Process, supply voltage, and temperature (PVT) variations in the controller device may cause changes in the voltage-to-time transfer function of amplifier 218 and adjustable delay circuit 216. The gain of amplifier 218 can be varied by control signal VG to compensate for PVT induced changes in the transfer function of circuits 216/218. Amplifier 218 generates a non-zero voltage across adjustable delay circuit 216 when no power supply noise is transmitted through the common mode voltage of CLK (when VDD is exactly at its nominal value). Voltage and temperature variations and their respective changes in the voltage-to-time transfer function can further be calibrated out during live operation by a periodic procedure.

The controller device adjusts the delay provided to CLKD based on the noise in $V_{CM,CLK}$ to cause PSIJ in CLKD and CLKR that matches the PSIJ in CLKT generated by clock buffer 246 in response to the memory VDD PSN. As a result, the power supply noise in the memory device supply voltage VDD is used to affect clock signal CLKR to best match the power supply noise in the memory device supply voltage VDD that affects CLKT (within a particular power supply noise frequency range).

The PSIJ caused by noise in VDD in the memory device usually does not match the PSIJ caused by supply voltage noise in the controller device. The circuitry of FIG. 2 helps to reduce the effect of memory device PSIJ by compensating for it in the controller device. FIG. 2 matches the PSIJ caused by VDD in the memory device on the controller device up to the bandwidth of the return path. For example, the system of FIG. 2 can track power supply noise in VDD in the range of 100-300 MHz.

Because the power supply noise (PSN) in VDD is returned over the common mode voltage of clock signal CLK, no extra pins are required to transfer the PSN from VDD to CLKR.

The flight time of the PSN in VDD through the return path described above to CLKR as PSIJ is referred to as $T_{FL,PSN}$. The first order flight time of the read data signal from circuit 202 to circuit 212 is referred to as $T_{FL,RD}$. The system of FIG. 2 causes $T_{FL,PSN}$ to approximately equal $T_{FL,RD}$. In the system of FIG. 2, the timing relationship between CLKR and the read data signal at circuit 212 is closer to an ideal value. In the embodiments depicted herein, the memory IC and the controller IC may utilize memory protocols such as double data rate (DDR), and future generations of dynamic random access memory signaling and logic layer protocols. In other embodiments, the controller IC and memory IC may utilize other types of memory array architectures and technologies, for example, non-volatile flash memory technology or resistance based memory array technology.

Figure 3:
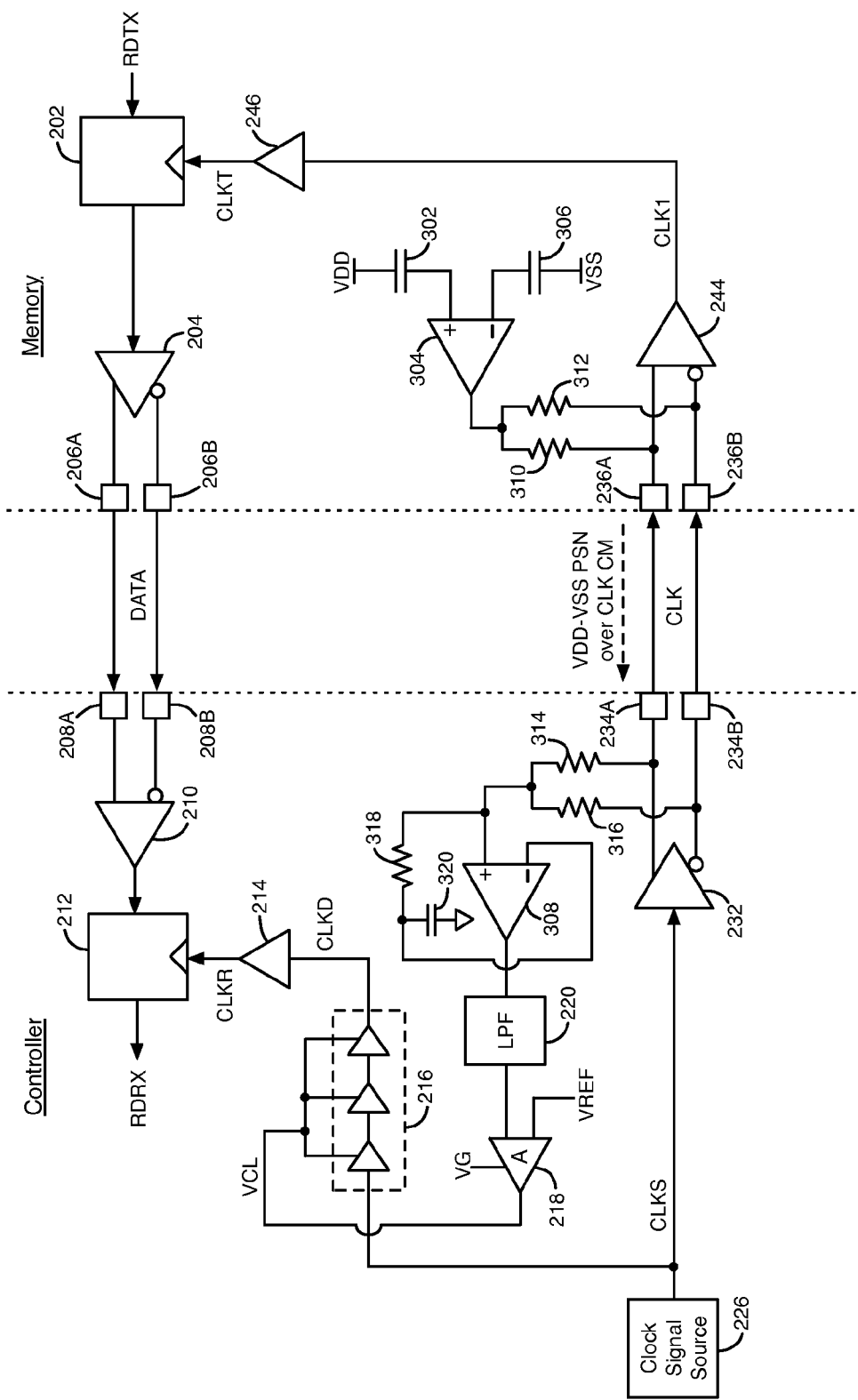
FIG. 3 illustrates an example system having a controller device that generates PSIJ in a receiver clock signal based on the power supply noise (PSN) minus the ground voltage noise (GVN) in a memory device.

FIG. 3 illustrates an example system that generates PSIJ in a receiver clock signal in a controller device based on power supply noise minus ground voltage noise in a memory device. The power supply noise (PSN) in VDD minus the ground voltage noise (GVN) in VSS is transmitted to the controller device through a clock signal common mode voltage. The controller device generates PSIJ in the receiver clock signal CLKR based on the clock signal common mode voltage. The PSIJ generated in CLKR matches the PSIJ added to the transmit clock signal CLKT, which then shows up on the data signal DATA at pins 206A-206B, within a frequency range without using extra pins. The system of FIG. 3 causes the timing relationship between the receiver clock signal CLKR and the read data received by the controller device to be closer to an ideal value despite the presence of PSIJ.

The system of FIG. 3 includes a controller integrated circuit (IC) device and a memory integrated circuit (IC) device. The memory device includes a transmitter timing circuit 202, a driver circuit 204, pins 206A-206B and 236A-236B, receiver circuit 244, clock buffer 246, amplifier 304, capacitors 302 and 306, and resistors 310 and 312. The controller device includes timing circuit 212, receiver circuit 210, pins 208A-208B and 234A-234B, clock buffer 214, adjustable delay circuit 216, variable gain amplifier 218, LPF 220, clock signal source 226, driver circuit 232, amplifier 308, capacitor 320, and resistors 314, 316, and 318.

In the memory device, the non-inverting input of amplifier 304 is AC-coupled to high supply voltage VDD through capacitor 302, and the inverting input of amplifier 304 is AC-coupled to a low supply voltage VSS through capacitor 306. Low supply voltage VSS is also referred to herein as a ground voltage. Amplifier 304 amplifies the difference between the power supply noise in VDD minus the noise in VSS to generate a output voltage signal. The output voltage signal of amplifier 304 is added to the common mode voltage across pins 236A-236B through resistors 310 and 312. The output voltage signal of amplifier 304 is returned to pins 234A-234B in the controller device as a varying signal in the common mode voltage of clock signal CLK.

Amplifier 308 receives the common mode voltage of CLK at its non-inverting input through resistors 314 and 316. A low pass filter formed by resistor 318 and capacitor 320 provides a filtered version of the common mode voltage of CLK to the inverting input of amplifier 308. Amplifier 308 amplifies the difference between the common mode voltage of CLK sent over pins 234A-234B and the filtered version of the common mode voltage of CLK to generate an output signal. The output signal of amplifier 308 varies based on the common mode voltage of clock signal CLK.

The output signal of amplifier 308 is filtered by low pass filter 220. The low frequency components of the output signal of amplifier 308 are passed by filter 220 to an input of variable gain amplifier 218. Amplifier 218 amplifies the difference between the signal passed by filter 220 and reference voltage VREF to generate control voltage signal VCL. VCL controls the delay that adjustable delay circuit 216 provides to CLKD, as with the system of FIG. 2.

Clock buffer 246 generates PSIJ in CLKT that is based on the PSN of VDD minus the GVN of VSS. The controller device in FIG. 3 generates PSIJ in CLKD/CLKR that replicates the PSIJ clock buffer 246 generates in CLKT. As a result, the PSN of VDD minus the GVN of VSS that affects clock signal CLKR tracks the PSN of VDD minus the GVN of VSS that affects CLKT, and thus the timing of the DATA signal at pins 206A-206B, within a particular power supply noise frequency range.

The system of FIG. 3 causes the flight time of the noise in VDD and VSS being generated in CLKR as PSIJ to approximately equal the first order flight time of the read data signal. As a result, the timing of CLKR relative to the read data signal is closer to being ideal.

Figure 4:
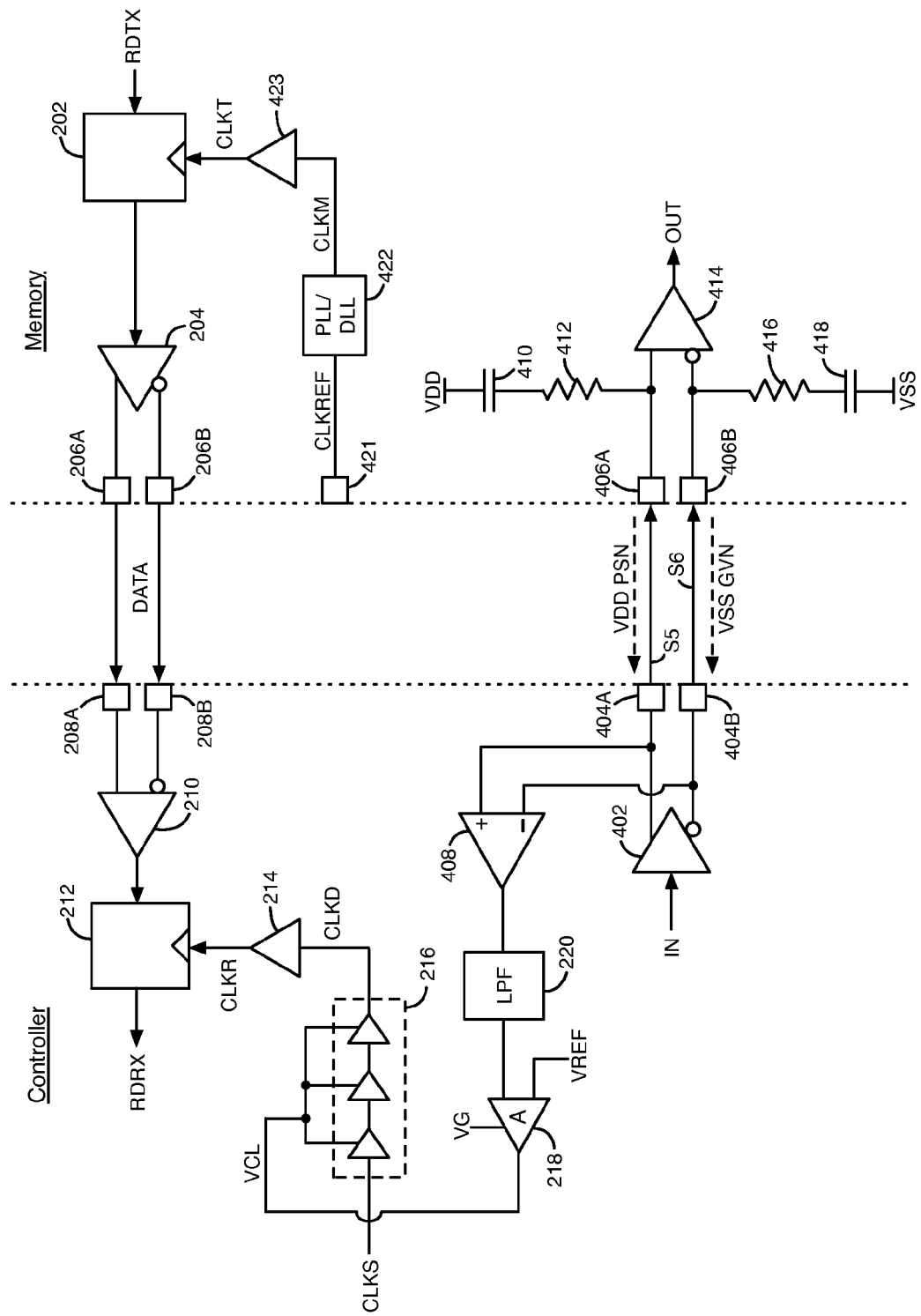
FIG. 4 illustrates another example system having a controller device that generates PSIJ in a receiver clock signal based on the PSN minus the GVN generated in a memory device.

FIG. 4 illustrates an example system that generates PSIJ in a receiver clock signal in a controller device based on the power supply voltage noise (PSN) minus the ground voltage noise (GVN) generated in a memory device. The PSN in VDD minus the GVN in VSS is transmitted to the controller device over a differential mode voltage across an extra set of pins. The controller device generates PSIJ in the receiver clock signal CLKR based on the differential mode voltage. The PSIJ generated in CLKR matches the PSIJ generated in the transmit clock signal CLKT within a particular frequency range. The system of FIG. 4 causes the timing relationship between CLKR and the read data signal as received by the controller device to be closer to an ideal timing relationship.

The system of FIG. 4 includes a controller IC device and a memory IC device. The memory device includes a transmitter timing circuit 202, a driver circuit 204, pins 206A-206B, pins 406A-406B, receiver circuit 414, resistors 412 and 416, capacitors 410 and 418, pin 421, circuit 422, and clock buffer circuit 423. The controller device includes timing circuit 212, receiver circuit 210, pins 208A-208B and 404A-404B, clock buffer 214, adjustable delay circuit 216, variable gain amplifier 218, LPF 220, driver circuit 402, and amplifier 408. Circuit 422 is a phase-locked loop (PLL) or a delay-locked loop (DLL).

PLL/DLL 422 receives a reference clock signal CLKREF through pin 421 from an external source. PLL/DLL 422 generates an output clock signal CLKM in response to CLKREF. Clock buffer 423 buffers clock signal CLKM to generate a transmit clock signal CLKT. Clock signal CLKT is provided to an input of transmitter timing circuit 202. PLL/DLL 422 is designed to compensate for low frequency jitter caused by clock buffer 423. Clock buffer 423 is coupled to receive VDD and VSS. Clock buffer 423 generates PSIJ in CLKT that is based on PSN in VDD minus GVN in VSS.

Driver circuit 402 is coupled to transmit a differential signal through pins 404A-404B, external signal lines S5-S6, and pins 406A-406B to input terminals of receiver circuit 414. Driver circuit 402, pins 404A-404B and 406A-406B, and receiver circuit 414 can be used for a variety of purposes. For example, driver circuit 402 may be only used to transmit a write data or data mask signal to receiver circuit 414. Therefore, driver circuit 402 and receiver circuit 414 might be disabled or inactive when VDD-VSS supply noise is being returned. Alternatively, driver circuit 402 may be used to transmit lower rate control signals to the memory device, such as serial configuration commands or a reset signal, which also might not be in use when VDD-VSS supply noise is being returned. In alternate embodiments, other pins with different idle states can be used as a return path for VDD noise or for VDD-VSS supply noise, as can be appreciated by one of skill in the art.

Pin 406A is AC-coupled to supply voltage VDD on the memory device through capacitor 410 and resistor 412. PSN in VDD is transmitted through pin 406A, signal line S5, and pin 404A to the non-inverting input of amplifier 408. Pin 406B is AC-coupled to ground voltage VSS through capacitor 418 and resistor 416. GVN in VSS is transmitted through pin 406B, signal line S6, and pin 404B to the inverting input of amplifier 408. The differential signal on signal lines S5-S6 varies based on the PSN in VDD minus the GVN in VSS.

Amplifier 408 amplifies the difference between the voltage at pin 404A and the voltage at pin 404B to generate an output signal. The output signal of amplifier 408 varies based on the differential signal on lines S5 and S6. The output signal of amplifier 408 is filtered by low pass filter 220 and transmitted to an input of amplifier 218. Amplifier 218 amplifies the difference between the signal passed by filter 220 and reference voltage VREF to generate the control voltage signal VCL.

The system of FIG. 4 generates PSIJ in CLKR that is based on the PSN of VDD minus the GVN of VSS in the memory device. The PSIJ in CLKR caused by the PSN of VDD minus the GVN of VSS tracks the PSIJ in CLKT generated by clock buffer 423 in response to the PSN of VDD minus the GVN of VSS within a particular frequency range. The system of FIG. 4 causes the flight time of the noise in VDD and VSS being added to CLKR as PSIJ to approximately equal the flight time of the read data signal so that the timing of CLKR relative to the read data signal is closer to being ideal. As a result, the system of FIG. 4 compensates for middle and high frequency PSN and GVN in CLKT caused by clock buffer 423 on the memory device.

Figure 5:
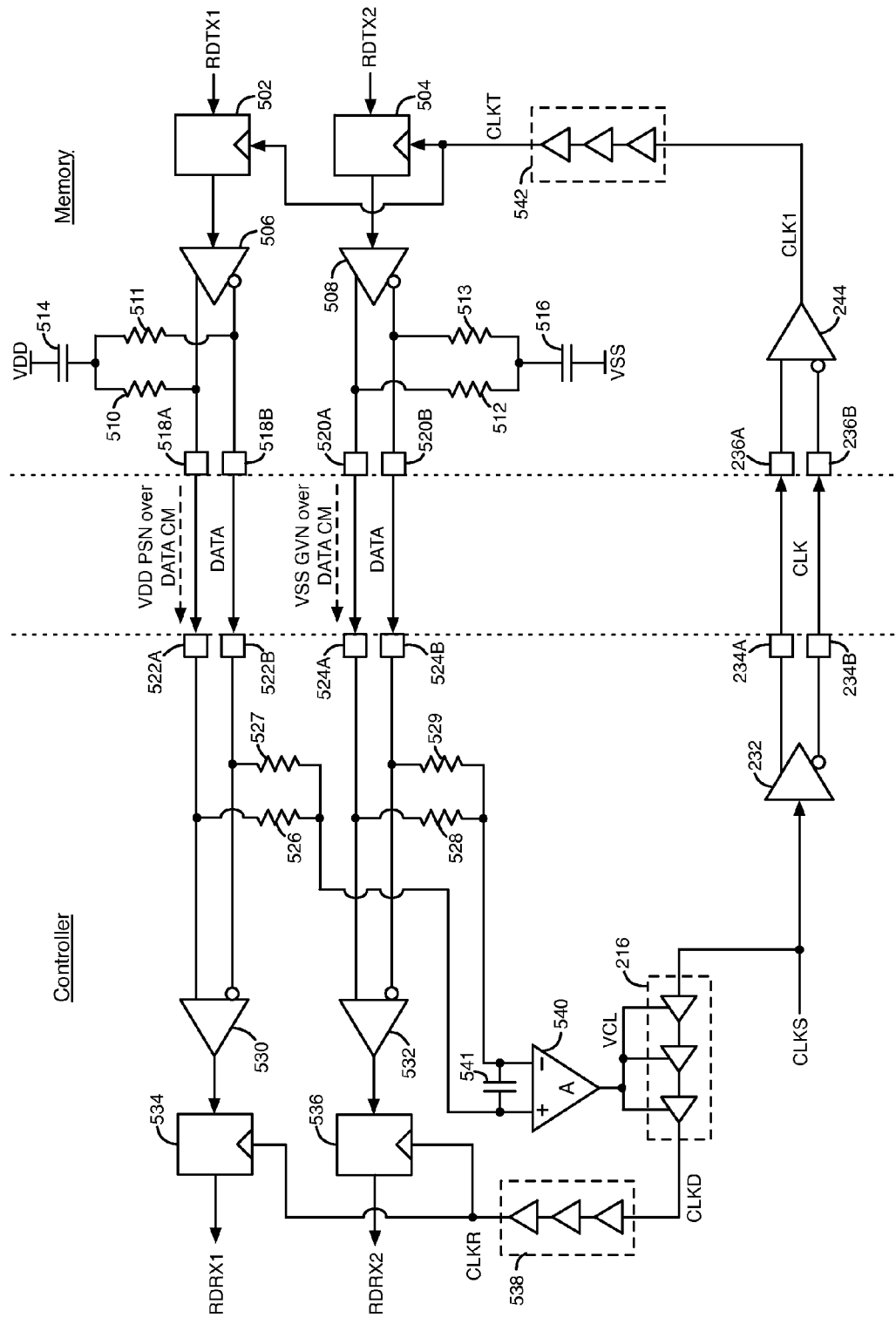
FIG. 5 illustrates yet another example system having a controller device that generates PSIJ in a receiver clock signal based on the PSN minus the GVN generated in a memory device.

FIG. 5 illustrates an example system having a controller device that generates PSIJ in a receiver clock signal based on the power supply noise (PSN) minus the ground voltage noise (GVN) generated in a memory device. The PSN in VDD is sent from the memory device to the controller device via a common mode voltage of a first data signal. The GVN in VSS is sent from the memory device to the controller device via a common mode voltage of a second data signal. The controller device generates PSIJ in the receiver clock signal CLKR based on the difference between the common mode voltages of the first and the second data signals. The PSIJ generated in CLKR matches the PSIJ generated in the transmit clock signal CLKT within a frequency range. CLKT is used to transmit the first and the second data signals to the controller device. The system of FIG. 5 causes the timing of CLKR relative to the timing of the first and the second data signals to be closer to ideal values.

The system of FIG. 5 includes a controller IC device and a memory IC device. The memory device includes pins 236A-236B, receiver circuit 244, clock network 542, transmitter timing circuits 502 and 504, driver circuits 506 and 508, resistors 510-513, capacitors 514 and 516, pins 518A-518B, and pins 520A-520B. The controller device includes adjustable delay circuit 216, driver circuit 232, pins 234A-234B, pins 522A-522B, pins 524A-524B, resistors 526-529, receiver circuits 530 and 532, timing circuits 534 and 536, clock network 538, amplifier 540, and capacitor 541. Timing circuits 534 and 536 can be, e.g., flip-flops or sampler circuits.

Receiver circuit 244 receives clock signal CLK from driver circuit 232 and drives the clock signal as CLK1 to clock network 542. Clock network 542 includes a chain of buffers that are coupled together in series. Clock network 542 buffers clock signal CLK1 to generate a transmit clock signal CLKT. CLKT is provided to clock inputs of transmitter timing circuits 502 and 504.

Transmitter timing circuit 502 sends a first read data signal RDTX1 to an input of driver circuit 506 in response to transmit clock signal CLKT. Driver circuit 506 drives the first read data signal as a differential signal to inputs of receiver circuit 530 through pins 518A-518B, two external signal lines, and pins 522A-522B. Receiver circuit 530 drives the first read data signal to an input of timing circuit 534. Timing circuit 534 outputs the first data read signal as RDRX1 in response to receiver clock signal CLKR.

Transmitter timing circuit 504 transmits a second read data signal RDTX2 to an input of driver circuit 508 in response to transmit clock signal CLKT. Driver circuit 508 drives the second read data signal to inputs of receiver circuit 532 as a differential signal through pins 520A-520B, two external signal lines, and pins 524A-524B. Receiver circuit 532 drives the second read data signal to an input of timing circuit 536. Timing circuit 536 outputs the second read data signal as RDRX2 in response to CLKR.

The common mode voltage of data pair pins 518A-518B is AC-coupled to supply voltage VDD on the memory device through resistors 510 and 511 and capacitor 514. Capacitor 514 and resistors 510-511 cause PSN in VDD to be transmitted via the common mode voltage of the first read data signal through external signal lines to the pins 522A-522B. Resistors 510 and 511 have the same resistance values.

Resistors 526-527 form an averaging circuit that averages the voltage signals at pins 522A-522B to generate the common mode voltage of the first read data signal at the non-inverting (+) input of amplifier 540. Resistors 526 and 527 have the same resistance values.

The common mode voltage of data pair pins 520A-520B is AC-coupled to ground voltage VSS on the memory device through resistors 512 and 513 and capacitor 516. Capacitor 516 and resistors 512-513 cause GVN in VSS to be transmitted via the common mode voltage of the second read data signal through external signal lines to pins 524A-524B. Resistors 512 and 513 have the same resistance values.

Resistors 528-529 are an averaging circuit that averages the voltage signals at pins 524A-524B to generate the common mode voltage of the second read data signal at the inverting (−) input of amplifier 540. Resistors 528 and 529 have the same resistance values. Capacitor 541 and resistors 526-529 function as low pass filters that filter high frequency noise from the common mode voltages received at the inputs of amplifier 540.

Amplifier 540 amplifies the difference between the filtered common mode voltage of the first read data signal and the filtered common mode voltage of the second read data signal to generate an output control voltage signal VCL. Amplifier 540 adjusts VCL based on the low frequency components of the PSN in VDD minus the GVN in VSS. Control voltage signal VCL controls the delay that adjustable delay circuit 216 provides to CLKD relative to CLKS.

Clock network 538 includes a chain of buffers that are coupled together in series. Clock network 538 buffers CLKD using the chain of buffers to generate the receiver clock signal CLKR. The receiver clock signal CLKR is transmitted to clock input terminals of timing circuits 534 and 536.

The controller device generates PSIJ in CLKR that is based on the PSN of VDD minus the GVN of VSS in the memory device. The PSIJ generated in CLKR based on noise in VDD and VSS tracks the PSIJ generated in CLKT by network 542 based on noise in VDD and VSS within a particular frequency range. The system of FIG. 5 causes the flight time of the noise in VDD and VSS being generated in CLKR as PSIJ to approximately equal the flight time of each of the first and second read data signals.

According to various embodiments, the links that are used to transmit the PSN in VDD and the GVN in VSS via common mode voltages can be transmitting data in either direction between the memory and controller devices. For example, the VDD PSN can be transmitted over the address pins. Addresses are transmitted from the controller device to the memory device over address pins during read operations.

Figure 6:
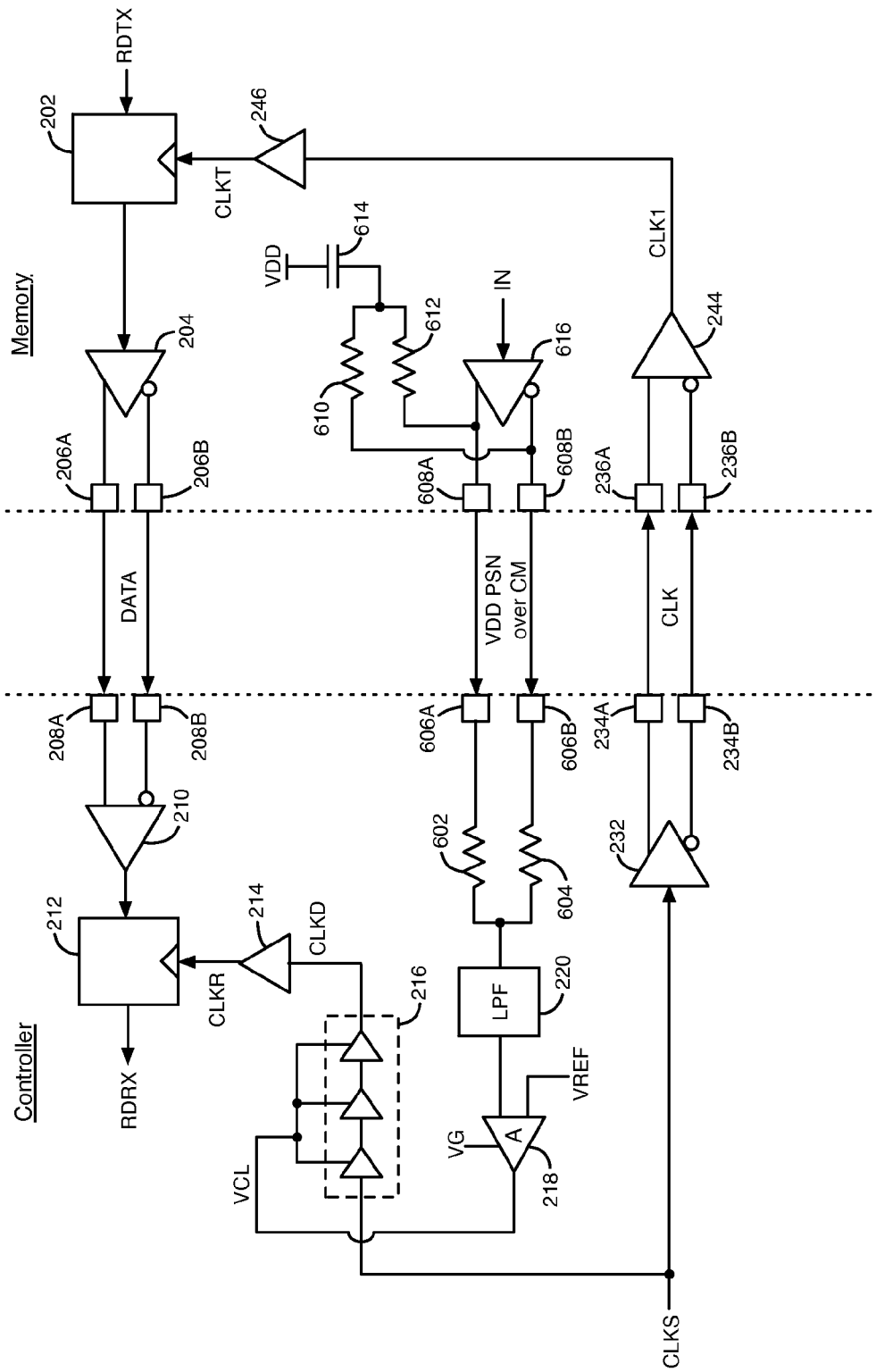
FIG. 6 illustrates another example system having a controller device that generates PSIJ in a receiver clock signal based on PSN in a memory device.

FIG. 6 illustrates an example system having a controller device that generates PSIJ in a receiver clock signal CLKR based on power supply noise (PSN) from a supply voltage VDD in a memory device. The PSN in supply voltage VDD is sent from the memory device to the controller device via a common mode voltage of a differential signal. The differential signal is transmitted to the controller device through pins and external signal lines that are different than the pins and external signal lines used to transmit a clock signal to the memory device. The controller device generates PSIJ in CLKR based on the common mode voltage of the differential signal. The PSIJ generated in CLKR matches the PSIJ generated in the transmit clock signal CLKT within a particular frequency range. The system of FIG. 6 causes the timing of CLKR relative to the timing of a read data signal to be closer to an ideal value.

The system of FIG. 6 includes a controller IC device and a memory IC device. The memory device includes a transmitter timing circuit 202, a driver circuit 204, pins 206A-206B, pins 236A-236B, receiver circuit 244, clock buffer 246, driver circuit 616, resistors 610 and 612, capacitor 614, and pins 608A-608B. The controller device includes timing circuit 212, receiver circuit 210, pins 208A-208B, clock buffer 214, adjustable delay circuit 216, variable gain amplifier 218, LPF 220, driver circuit 232, pins 234A-234B, resistors 602 and 604, and pins 606A-606B.

In FIG. 6, clock signal CLKS is transmitted to the input terminal of driver circuit 232. Driver circuit 232 transmits CLKS to receiver circuit 244 as clock signal CLK over external signal lines.

Driver circuit 616 in the memory device may be used to transmit a differential signal (e.g., a clock, control, or data signal) to the controller device through pins 608A-608B. Alternatively, driver circuit 616 may be an unused driver circuit or a driver circuit that is only used in limited situations.

Pin 608A is AC-coupled to the memory device supply voltage VDD through resistor 612 and capacitor 614, and pin 608B is AC-coupled to VDD through resistor 610 and capacitor 614. Resistors 610 and 612 have the same resistance values. PSN in VDD is induced in the common mode voltage of the differential signal across pins 608A-608B through capacitor 614 and resistors 610 and 612. The PSN in VDD is transmitted via the common mode voltage of the differential signal through external signal lines to pins 606A-606B in the controller device.

Resistors 602 and 604 are coupled to pins 606A-606B, respectively. Resistors 602 and 604 have the same resistance values. Resistors 602 and 604 are an averager circuit that averages the voltage signals at pins 606A-606B to generate the common mode voltage of the differential signal at the input of LPF 220. LPF 220 provides the low frequency components of the common mode voltage of the differential signal to amplifier 218. Amplifier 218 compares the common mode voltage after being filtered by LPF 220 to VREF to generate VCL, as discussed above.

The controller device generates PSIJ in clock signal CLKR that is based on the PSN of the memory device supply voltage VDD. Thus, the PSN in VDD that affects CLKR tracks the PSN in VDD that affects CLKT in the memory device within a particular frequency range of the PSN.

The system of FIG. 6 causes the flight time of the PSN in VDD to PSIJ in CLKR to approximately equal the flight time of the read data signal. As a result, the timing relationship between CLKR and the read data signal is closer to an ideal value.

Figure 7:
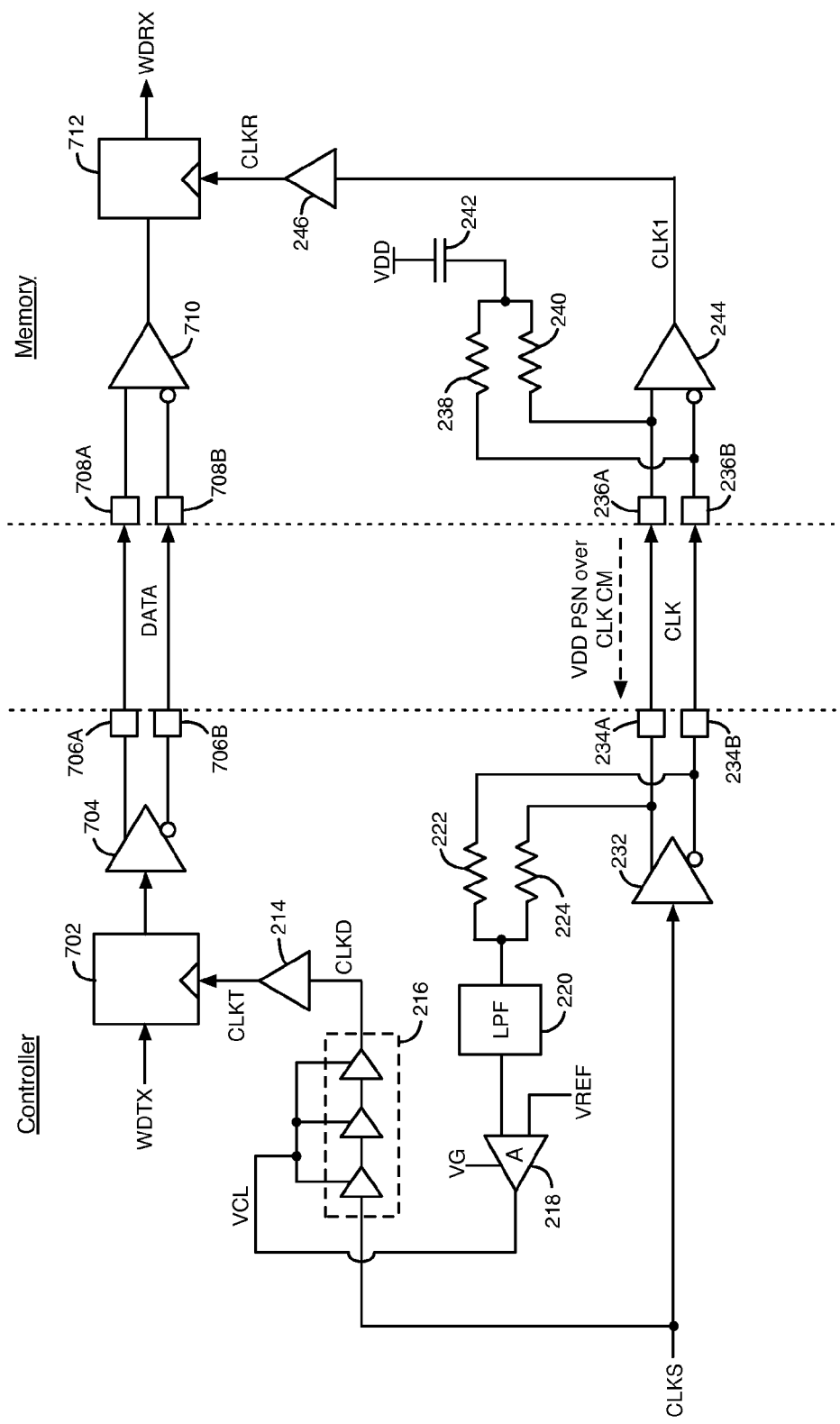
FIG. 7 illustrates an example system having a controller device that generates PSIJ in a transmit clock signal based on PSN in a memory device.

FIG. 7 illustrates an example system having a controller device that generates PSIJ in a transmit clock signal CLKT based on PSN in a memory device supply voltage VDD. The PSN in VDD is transmitted from the memory device to the controller device through external signal lines via a common mode voltage of a clock signal. The controller device generates PSIJ in CLKT that tracks the PSIJ in receiver clock signal CLKR based on the common mode voltage without using extra pins. The system of FIG. 7 causes the timing relationship between a write data signal and CLKR to be closer to an ideal value.

The system of FIG. 7 includes a controller IC device and a memory IC device. The memory IC device includes a receiver timing circuit 712, a receiver circuit 710, pins 708A-708B and 236A-236B, resistors 238 and 240, capacitor 242, receiver circuit 244, and clock buffer 246. The controller IC device includes transmitter timing circuit 702, driver circuit 704, pins 706A-706B and 234A-234B, clock buffer 214, adjustable delay circuit 216, variable gain amplifier 218, LPF 220, resistors 222 and 224, and driver circuit 232.

In the controller device, the transmitter timing circuit 702 transmits a write data signal WDTX to an input of driver circuit 704 in response to transmit clock signal CLKT. Clock buffer circuit 214 generates CLKT as a delayed and buffered version of clock signal CLKD. Driver circuit 704 transmits the write data signal to the memory device, for example, in the form of a differential signal. The write data signal is routed from driver 704 through pins 706A-706B, external signal lines, and pins 708A-708B to inputs of receiver circuit 710.

Receiver circuit 710 transmits the write data signal (e.g., as a single-ended signal) to an input of receiver timing circuit 712. Receiver timing circuit 712 outputs the write data signal WDRX in response to receiver clock signal CLKR. Clock buffer 246 buffers clock signal CLK1 to generate clock signal CLKR. Clock buffer 246 generates PSIJ in CLKR based on PSN in VDD. Bits in the write data signal WDRX can be stored in memory cells in the memory device.

As with the embodiment of FIG. 2, the system of FIG. 7 generates a compensating PSIJ in clock signal CLKD that is based on the PSN information of memory device supply voltage VDD. In the system of FIG. 7, the PSIJ generated in CLKT from noise in VDD matches the PSIJ generated in CLKR from noise in VDD within a particular frequency range of the PSN. As a result, the timing relationship between CLKR and the write data signal at circuit 712 is closer to being ideal. All embodiments described herein used to convey the PSIJ information for the receiver clock signal also applies to the transmit clock signal from the controller device.

In the embodiments of FIGS. 2-3 and 5-6, a source clock signal CLKS is routed to the memory device through external signal lines and internal circuits to generate CLKT, which is used to transmit a read data signal. The read data signal is transmitted through external signal lines from the memory device to the controller device. CLKS is routed through circuits within the controller device to generate CLKR, which is used to capture the read data signal. Because of differences in the delays of the clock and data signals, a clock edge in CLKR used to capture a bit in the read data signal may not correspond to the same clock edge in CLKT that was used to transmit the same bit in the read data signal.

For example, the clock edge of CLKT used to transmit a read data bit may be generated in response to one clock edge in CLKS. That clock edge in CLKS may be 4-8 clock periods ahead of another clock edge in CLKS that generates the clock edge in CLKR used to capture the same read data bit. Each period of CLKS can, for example, correspond to one bit period (i.e., one unit interval) in the read data signal.

Jitter can cause variations in the duration of the periods of CLKS. Therefore, it is desirable to have both a clock edge of CLKT used to transmit a read data bit and a clock edge of CLKR used to capture the read data bit be generated in response to the same (or proximal) clock edge in CLKS, for each read data bit. This technique is referred to as edge-coloring the data clocks. Because the receiver clock path in the controller typically has less delay than the delay from CLKS to CLKT plus the flight time of read data from the memory device transmitter to the controller receiver, edge-coloring the data clocks can be achieved by adding an extra delay line in the receive path from CLKS to CLKR. The extra delay line causes the flight time of a clock edge of CLKS to CLKR to equal or approximately equal the flight time of the same clock edge of CLKS to CLKT plus the flight time of the read data bit from the transmitter to the receiver.

Figure 8:
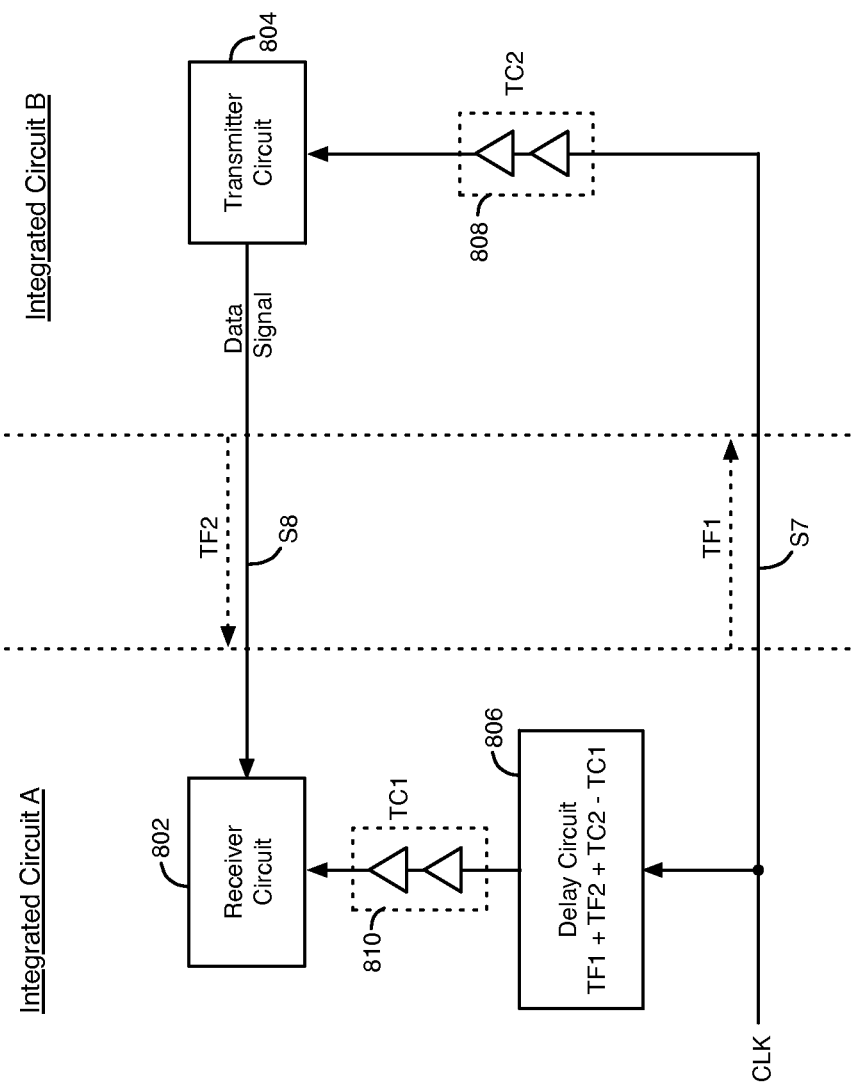
FIG. 8 illustrates an example system that generates colored data by matching signal flight times.

FIG. 8 illustrates an example system that generates colored data by matching signal flight times. In the system of FIG. 8, a data signal is transmitted from integrated circuit B to integrated circuit A. For each bit in the data signal, integrated circuit A captures the bit in response to the same clock edge (or a proximal clock edge in a sequence of clock edges) in a clock signal CLK that is used to transmit the bit from integrated circuit B. The system of FIG. 8 provides edge-colored data clocks to reduce or eliminate the effects of high frequency jitter in CLK that is not in common between integrated circuits A and B.

The system of FIG. 8 includes integrated circuits A and B (e.g., a controller IC and a memory IC). Integrated circuit A includes receiver circuit 802, clock network 810, and delay circuit 806. Delay circuit 806 can have an adjustable delay or a fixed delay. Integrated circuit B includes transmitter circuit 804 and clock network 808.

A clock signal CLK is transmitted from integrated circuit A to integrated circuit B through external signal line S7 and clock network 808 to an input of transmitter circuit 804. Clock signal CLK is also transmitted within integrated circuit A through delay circuit 806 and clock network 810 to an input of receiver circuit 802. Transmitter circuit 804 transmits a data signal to receiver circuit 802 through external signal line S8 in response to clock signal CLK from clock network 808. Receiver circuit 802 captures the data signal in response to clock signal CLK from clock network 810.

External signal line S7 has a delay of TF1, and external signal line S8 has a delay of TF2. The delay of clock network 810 is TC1, and the delay of clock network 808 is TC2. The delay of delay circuit 806 is set to be equal to or approximately equal to TF1+TF2+TC2−TC1. The delay added to CLK by circuits 806 and 810 is TF1+TF2+TC2. The delay added to CLK by external signal line S7 and clock network 808 is TF1+TC2, and the delay of the data signal from transmitter circuit 804 to receiver circuit 802 is TF2. Thus, the delay in the path of CLK to receiver circuit 802 is equal to or about equal to the delay in the path of CLK to transmitter circuit 804 plus the delay of the data signal from transmitter circuit 804 to receiver circuit 802.

Delay circuit 806 causes the clock edge of CLK that is used to transmit a data bit in circuit 804 to be the same as the clock edge of CLK that is used to capture the data bit in circuit 802, for each data bit transmitted from circuit 804 to circuit 802. As a result, the data transmitted from transmitter circuit 804 to receiver circuit 802 is colored, which reduces the adverse effects of high frequency jitter in CLK on receiver circuit 802 during the process of capturing the data.

Figure 9:
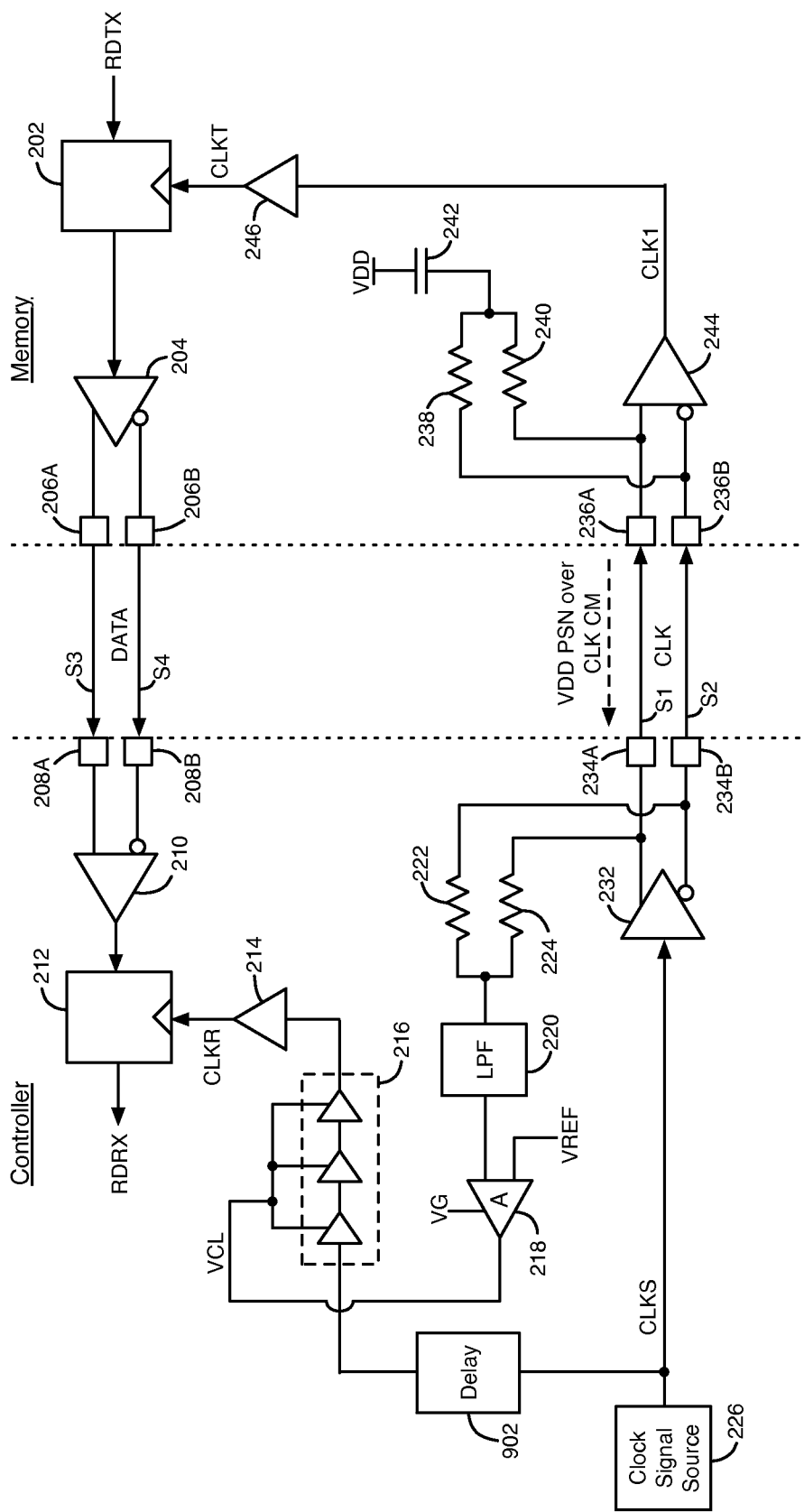
FIG. 9 illustrates another example system that provides colored read data by adding an adjustable delay circuit in the path of the receiver clock signal.

FIG. 9 illustrates another example system that provides colored read data by adding an adjustable delay circuit in the path of the receiver clock signal. The delay of the adjustable delay circuit is set to cause the flight time of the receiver clock signal CLKR to approximate or substantially match the flight time of the transmit clock signal CLKT plus the flight time of the read data signal. As a result, the controller device captures a read data bit in response to the clock edge (or a proximal clock edge in a sequence of clock edges) of the source clock signal CLKS that was used to transmit the read data bit, for each read data bit. Alternatively, the system of FIG. 9 can cause the controller device to capture a read data bit in response to a clock edge in CLKS that is closer to the clock edge in CLKS used to transmit the read data bit. The system of FIG. 9 reduces or eliminates the adverse effects of high frequency jitter during the process of capturing the data.

The controller and memory devices of FIG. 9 include all of the same components that are shown in and described above with respect to FIG. 2. FIG. 9 also includes a delay circuit 902. The delay of delay circuit 902 is selected to approximate or substantially match the flight time delay of CLK through external signal lines S1-S2, plus the flight time delay of DATA through external signal lines S3-S4, plus or minus any difference between the delay of the on-chip clock network that routes edges in CLKS to CLKR and the delay of the on-chip clock network that routes edges in CLKS to CLKT. Delay circuit 902 can have an adjustable delay or a fixed delay. In an embodiment, delay circuit 902 may be combined with circuit 216.

Delay circuit 902 causes the flight time of clock edges from CLKS to CLKR to be equal to or approximately equal to the flight time of clock edges from CLKS to CLKT plus the flight time of bits in the read data signal from transmitter timing circuit 202 to receiver timing circuit 212. Delay circuit 902 colors the read data signal by causing receiver timing circuit 212 to capture each read data bit in response to the clock edge (or a proximal clock edge in a sequence of clock edges) of CLKS that was used by transmitter timing circuit 202 to transmit that read data bit. As a result, the effects of high frequency jitter in CLKS are reduced or eliminated.

Figure 10:
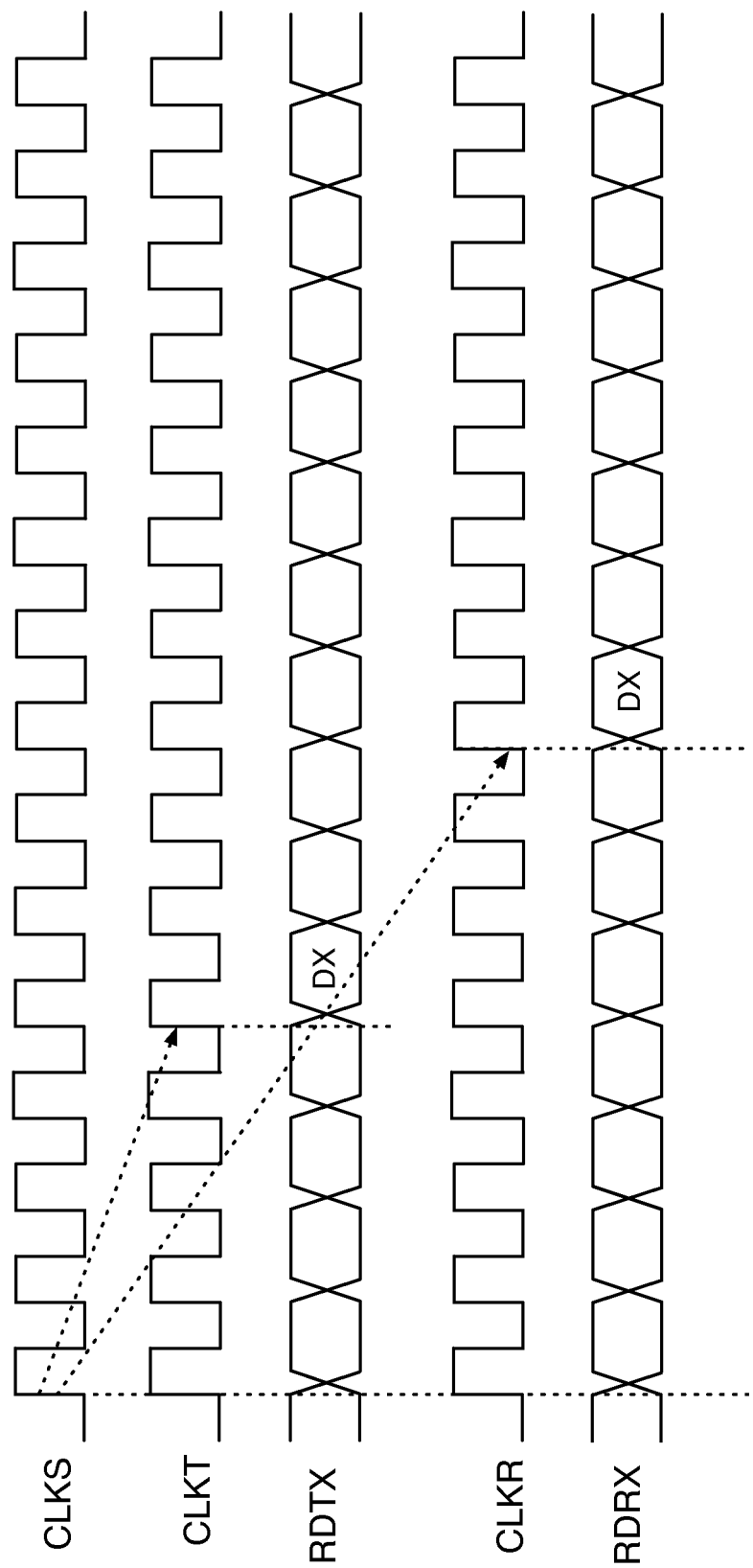
FIG. 10 is a timing diagram that illustrates example waveforms for some of the signals shown in FIG. 9.

FIG. 10 is a timing diagram that illustrates example waveforms for signals CLKS, CLKT, RDTX, CLKR, and RDRX. The dotted arrows in FIG. 10 show corresponding clock edges in clock signals CLKS, CLKT, and CLKR. For example, the first rising edge of CLKS shown in FIG. 10 corresponds to the fifth rising edge of CLKT shown in FIG. 10. Thus, CLKT is delayed by 4 clock periods relative to CLKS in this example. An example read data bit DX in read data signal RDTX is transmitted by transmitter timing circuit 202 to the controller device in response to the fifth rising edge of CLKT.

Because of the flight time for transmitted data bit DX to reach the receiver, the example read data bit DX is captured by receiver timing circuit 212 as signal RDRX in response to the eighth rising edge of CLKR. Therefore, CLKR is delayed by 7 clock periods relative to CLKS, so that the rising edge of CLKR used to capture the read data bit DX corresponds to the first rising edge of CLKS. FIG. 10 shows that receiver timing circuit 212 captures read data bit DX in response to the same clock edge of CLKS that was used by transmitter timing circuit 202 to transmit read data bit DX.

Different embodiments of the system of FIG. 9 can have external signal lines S1-S4 with different lengths. The delay of delay circuit 902 can be adjusted to compensate for variations in the lengths of external signal lines S1-S4 so that the flight times of the clock and data signals continue to be colored as described above.

Delay circuit 902 can, for example, be an adjustable delay line on the controller device, an off-chip transmission line, a board trace, or a routing line in a package. A delay line 902 on the controller device can be, for example, a voltage controlled delay line, an inductor-capacitor based delay circuit, or a variable universal clock tree. An adjustable off-chip transmission line 902 can be implemented, for example, using a tapped transmission line having adjustable termination points that connect to the controller device.

The system of FIG. 9 can also cause PSN for VDD to be colored with respect to the read data signal if the flight time of the PSN in VDD added to CLKR as PSIJ approximately equals the flight time of the read data signal, as described above with respect to FIG. 2.

In example embodiments presented herein, clock generation on the memory device does not require the use of a phase-locked loop (PLL) or delay-locked loop (DLL) to provide for a memory solution with reduced power consumption relative to a memory solution that utilizes PLL or DLL based clock generation. A PLL is included on the controller device to generate at least one clock signal that is transmitted to the memory device. The memory device can switch between a low power mode and an active, high performance mode very quickly by enabling and disabling the clock signal provided by the controller device.

Multiple embodiments are shown herein using capacitors or capacitor/resistor networks to couple power supply noise of one device into the common mode of a pair of differential clock or signal wires. In alternate embodiments, a different network can be used to couple power supply noise onto the common mode of a differential signal using a different configuration of components to achieve injection of the noise from one device to another device.

Figure 11A:
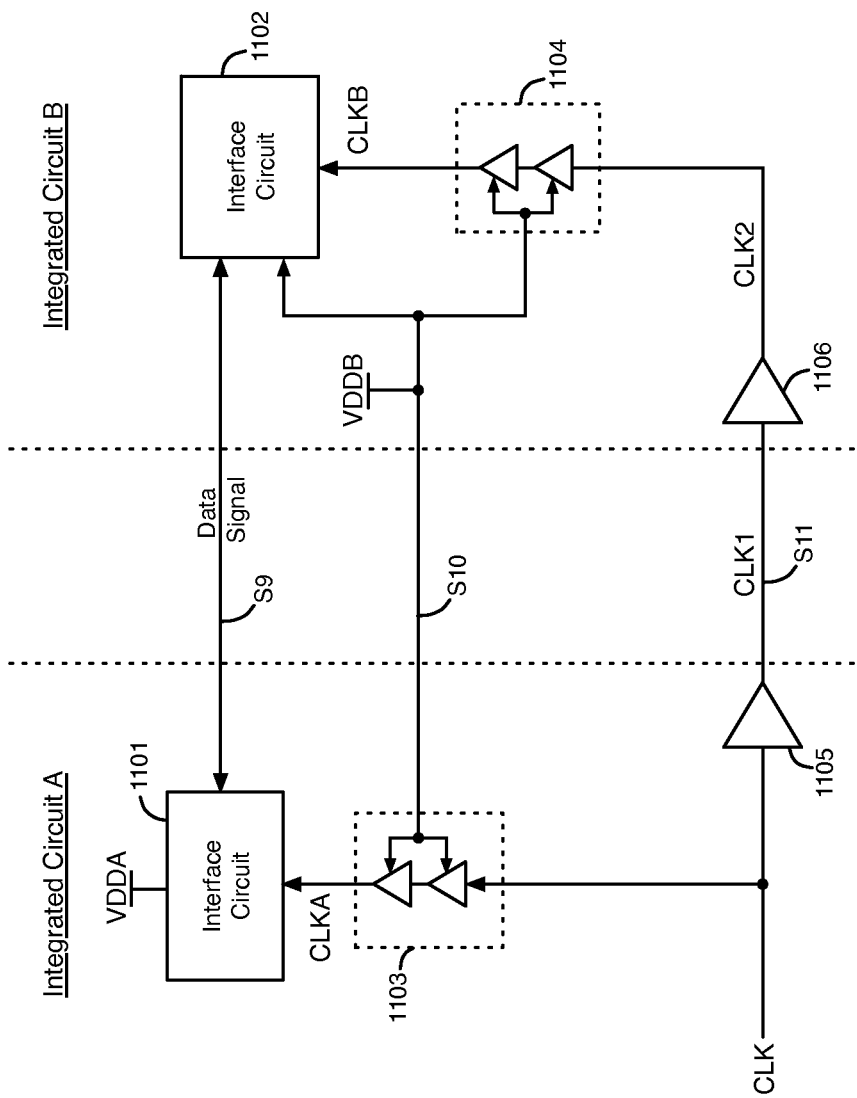
FIG. 11A illustrates an example system having a first integrated circuit that generates a clock signal having power supply induced jitter (PSIJ), which is based on a supply voltage that is provided from a second integrated circuit.

FIG. 11A illustrates an example system having a first integrated circuit that generates a clock signal having power supply induced jitter (PSIJ), which is induced by variations in a supply voltage that is provided from a second integrated circuit. The system of FIG. 11A includes a first integrated circuit A and a second integrated circuit B. Integrated circuit A includes an interface circuit 1101, a clock network circuit 1103 including one or more clock buffer circuits, and a clock transmitter circuit 1105. Integrated circuit B includes an interface circuit 1102, a clock network circuit 1104 including one or more clock buffer circuits, and a clock receiver circuit 1106.

A periodic clock signal CLK is provided to clock network circuit 1103 and clock transmitter circuit 1105 on integrated circuit A. One or more clock buffer circuits in clock network circuit 1103 provide clock signal CLK to interface circuit 1101 as clock signal CLKA. Clock transmitter circuit 1105 transmits clock signal CLK to integrated circuit B as clock signal CLK1 through external conductor S11. Clock signal CLK1 may be transmitted from integrated circuit A to integrated circuit B through differential or single-ended signaling via one or two respective conductors. Clock receiver circuit 1106 generates an internal clock signal CLK2 from the received clock signal CLK1. Clock signal CLK2 is provided to clock network 1104. One or more clock buffer circuits in clock network 1104 provide clock signal CLK2 to interface circuit 1102 as clock signal CLKB.

A supply voltage VDDB is provided to clock network 1104. One or more clock buffer circuits in clock network circuit 1104 draw current that is sourced from supply voltage VDDB. Supply voltage VDDB may be generated in integrated circuit B or provided to integrated circuit B from an external source. The clock buffer circuits in clock network 1104 buffer clock signal CLK2 to generate clock signal CLKB. Supply voltage VDDB may have power supply noise that causes the clock buffer circuits in clock network circuit 1104 to generate clock signal CLKB having power supply induced jitter (PSIJ) as a result of the power supply noise from supply voltage VDDB.

Interface circuit 1102 transfers data with interface circuit 1101 through an external conductor S9. For example, in an embodiment, interface circuit 1101 includes a receiver circuit, and interface circuit 1102 includes a transmitter circuit. In this embodiment, the transmitter circuit in interface circuit 1102 transmits a data signal to the receiver circuit in interface circuit 1101. Interface circuit 1102 outputs data synchronously with respect to clock signal CLKB. Interface circuit 1101 receives the data synchronously with respect to clock signal CLKA.

According to another embodiment, interface circuit 1101 includes a transmitter circuit, and interface circuit 1102 includes a receiver circuit. In this embodiment, the transmitter circuit in interface circuit 1101 transmits a data signal to the receiver circuit in interface circuit 1102. Interface circuit 1101 outputs data synchronously with respect to clock signal CLKA. Interface circuit 1102 receives the data synchronously with respect to clock signal CLKB.

The data signal is transmitted between integrated circuits A and B through an external conductor S9. The data signal may be transmitted between integrated circuits A and B through differential or single-ended signaling via one or two respective conductors. Internal buffer circuits in each of interface circuits 1101 and 1102 drive the data signal between interface circuits 1101 and 1102 and external pins.

Supply voltage VDDB is provided to interface circuit 1102. Interface circuit 1101 receives a different supply voltage VDDA that is generated in integrated circuit A or provided to integrated circuit A from an external source.

Supply voltage VDDB is provided from integrated circuit B to integrated circuit A through external conductor S10. Supply voltage VDDB is provided to clock network circuit 1103 in integrated circuit A. The one or more clock buffer circuits in clock network 1103 buffer clock signal CLK to generate clock signal CLKA. One or more clock buffer circuits in clock network 1103 draw current that is sourced from supply voltage VDDB. Supply voltage VDDB may have power supply noise that causes the clock buffer circuits in clock network circuit 1103 to generate clock signal CLKA having power supply induced jitter (PSIJ). One or more of the clock buffer circuits in clock network 1103 may receive a different supply voltage, such as VDDA.

The PSIJ that clock network 1103 generates in CLKA based on power supply noise in supply voltage VDDB substantially matches the PSIJ that clock network 1104 generates in CLKB based on power supply noise in VDDB. In the system of FIG. 11A, the PSIJ in integrated circuits A and B affects clock signals CLKA and CLKB substantially in-common within a particular power supply noise frequency range. As a result, the impact of any PSIJ in CLKA and CLKB is mitigated. Also, the ability of interface circuit 1101 or 1102 to capture a data signal having PSIJ on conductor S9 is improved. According to an embodiment, clock network 1104 generates a delay in CLKB that is equal to the delay clock network 1103 generates in CLKA.

Figure 11B:
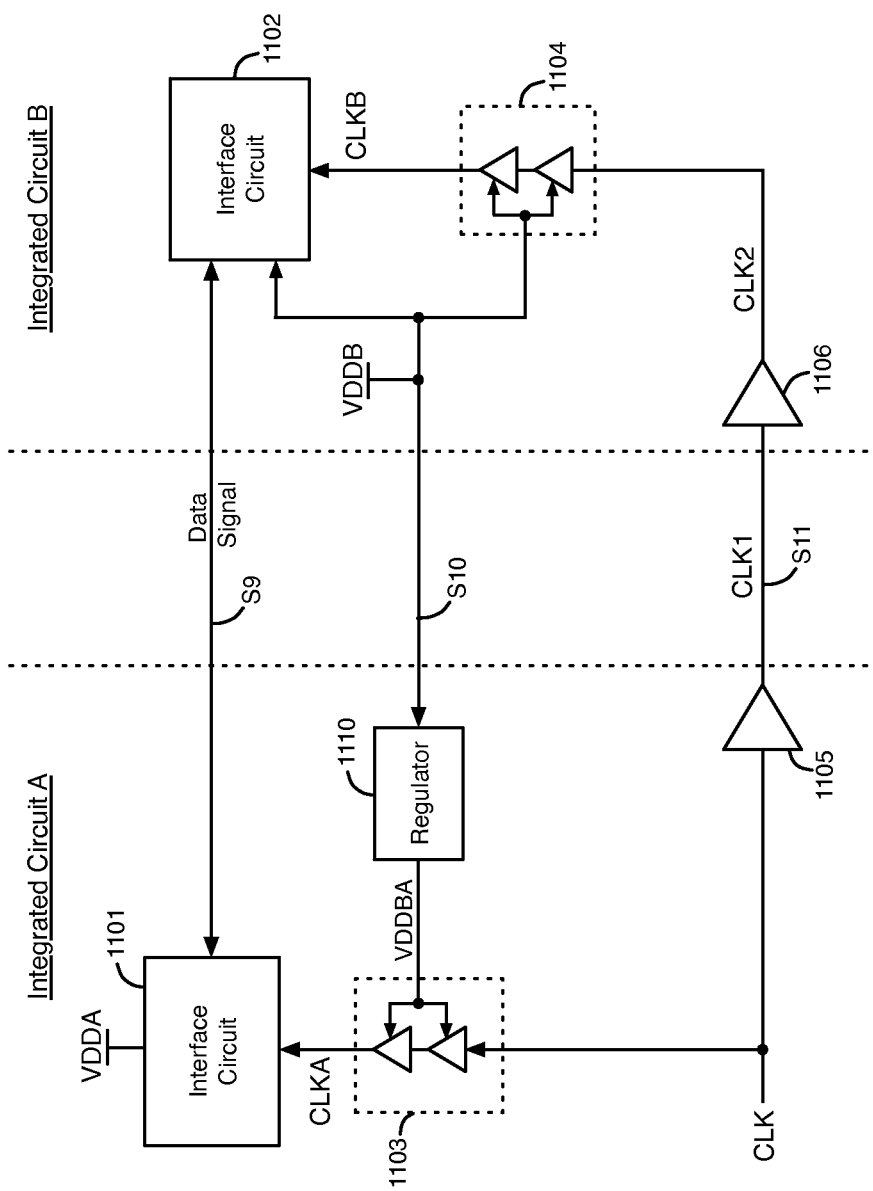
FIG. 11B illustrates an example system having a first integrated circuit that generates a clock signal having power supply induced jitter, which is based on a first supply voltage that is generated using a second supply voltage provided from a second integrated circuit.

FIG. 11B illustrates an example system having a first integrated circuit A that generates a clock signal having power supply induced jitter, which is based on a first supply voltage that is generated using a second supply voltage provided from a second integrated circuit B. Integrated circuit A includes interface circuit 1101, clock network circuit 1103, clock transmitter circuit 1105, and regulator circuit 1110. Integrated circuit B includes interface circuit 1102, clock network circuit 1104, and clock receiver circuit 1106.

In the embodiment of FIG. 11B, supply voltage VDDB is provided from integrated circuit B to regulator circuit 1110 through external conductor S10. Regulator circuit 1110 may be, for example, a DC-DC converter circuit or another type of regulator circuit. Regulator circuit 1110 generates an output supply voltage VDDBA using current that is sourced from the supply voltage VDDB received from integrated circuit B. Regulator circuit 1110 generates power supply noise in supply voltage VDDBA that matches the power supply noise in VDDB. Regulator 1110 is selected to have a noise bandwidth that passes most or all of the significant power supply noise in the system from VDDB to VDDBA.

Integrated circuits A and B may use different supply voltages in the embodiment of FIG. 11B. If clock network 1103 requires a smaller supply voltage than VDDB, regulator circuit 1110 generates a supply voltage VDDBA that is less than supply voltage VDDB. If clock network 1103 requires a larger supply voltage than VDDB, regulator circuit 1110 generates a supply voltage VDDBA that is greater than supply voltage VDDB. Alternatively, regulator circuit 1110 may generate a supply voltage VDDBA that equals supply voltage VDDB.

Supply voltage VDDBA is provided to clock network 1103 in integrated circuit A. One or more clock buffer circuits in clock network 1103 draw current that is sourced from supply voltage VDDBA. The clock buffer circuits in clock network 1103 buffer clock signal CLK to generate clock signal CLKA. Clock network 1103 may have clock buffer circuits that receive a different supply voltage, such as VDDA.

In the embodiment of FIG. 11B, the power supply induced jitter (PSIJ) that clock network 1103 generates in CLKA based on power supply noise in supply voltage VDDBA substantially matches the PSIJ that clock network 1104 generates in CLKB based on the power supply noise in VDDB.

In the system of FIG. 11B, the power supply noise in supply voltages VDDBA and VDDB affects clock signals CLKA and CLKB substantially in-common within a particular power supply noise frequency range. As a result, the impact of any PSIJ in CLKA and CLKB is mitigated, and the ability of interface circuit 1101 or 1102 to capture a data signal having PSIJ is improved, because PSIJ timing loss is reduced by making the jitter substantially in-common within the frequency range.

Figure 12A:
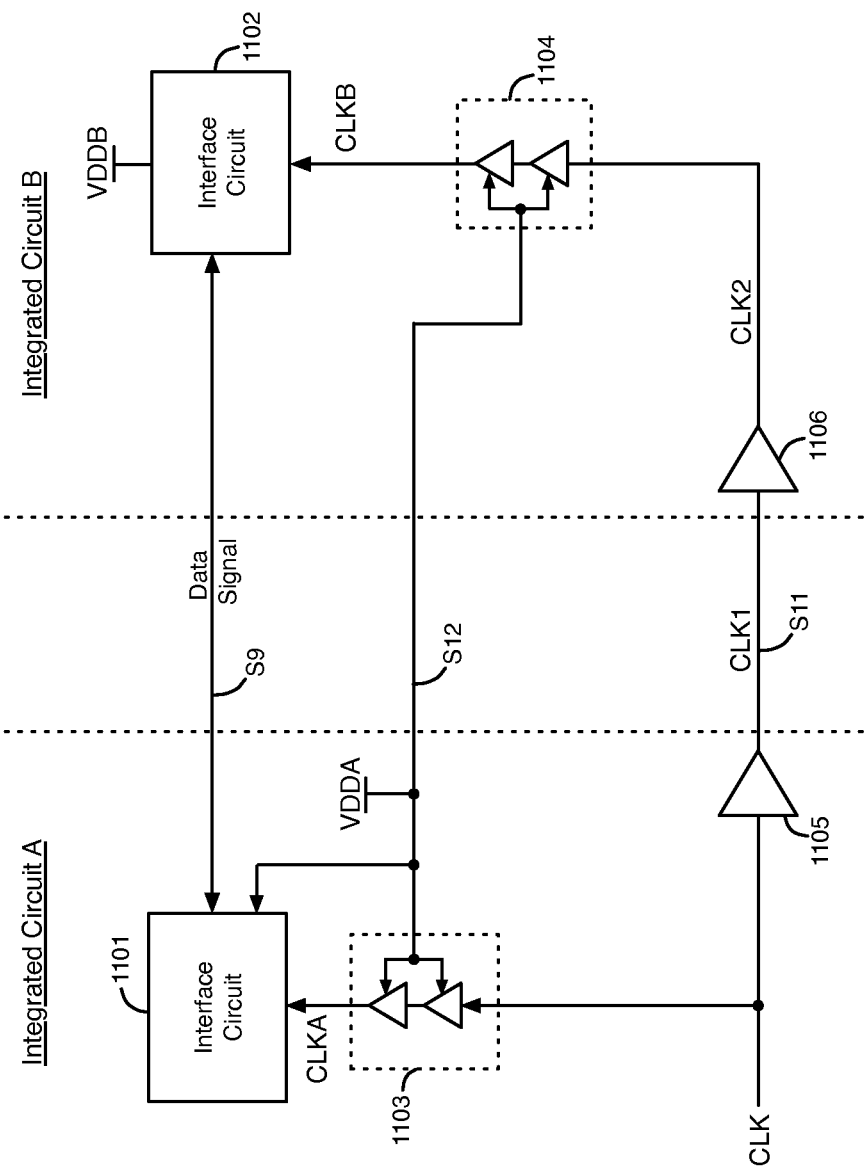
FIG. 12A illustrates another example system that has a first integrated circuit generating a clock signal having power supply induced jitter, which is based on a supply voltage that is provided from a second integrated circuit.

FIG. 12A illustrates another example system that has a first integrated circuit B generating a clock signal having power supply induced jitter, which is based on a supply voltage that is provided from a second integrated circuit A. Integrated circuit A includes interface circuit 1101, clock network circuit 1103, and clock transmitter circuit 1105. Integrated circuit B includes interface circuit 1102, clock network circuit 1104, and clock receiver circuit 1106.

Supply voltage VDDA is provided to interface circuit 1101 and to clock network 1103. Supply voltage VDDA may be generated in integrated circuit A or provided to integrated circuit A from an external source. One or more clock buffer circuits in clock network 1103 draw current that is sourced from supply voltage VDDA. Supply voltage VDDA may have power supply noise that causes the clock buffer circuits in clock network 1103 to generate power supply induced jitter (PSIJ) in clock signal CLKA.

Supply voltage VDDB is provided to interface circuit 1102. Supply voltage VDDB may be generated in integrated circuit B or provided to integrated circuit B from an external source.

Supply voltage VDDA is provided from integrated circuit A to integrated circuit B through external conductor S12. Supply voltage VDDA is provided to clock network 1104 in integrated circuit B. One or more of the clock buffer circuits in clock network 1104 that buffer clock signal CLK2 to generate clock signal CLKB draw current that is sourced from supply voltage VDDA. Clock network 1104 may have one or more clock buffer circuits that receive a different supply voltage.

In FIG. 12A, the PSIJ that clock network 1104 generates in CLKB based on power supply noise in supply voltage VDDA substantially matches the PSIJ that clock network 1103 generates in CLKA based on the power supply noise in VDDA. The PSIJ in integrated circuits A and B affects clock signals CLKA and CLKB substantially in-common within a particular power supply noise frequency range. As a result, the impact of any PSIJ in CLKA and CLKB is reduced, which, similar to the techniques of FIGS. 11A and 11B, improves the ability of interface circuit 1101 or 1102 to accurately capture a data signal having PSIJ on conductor S9 by making PSIJ substantially in-common.

Figure 12B:
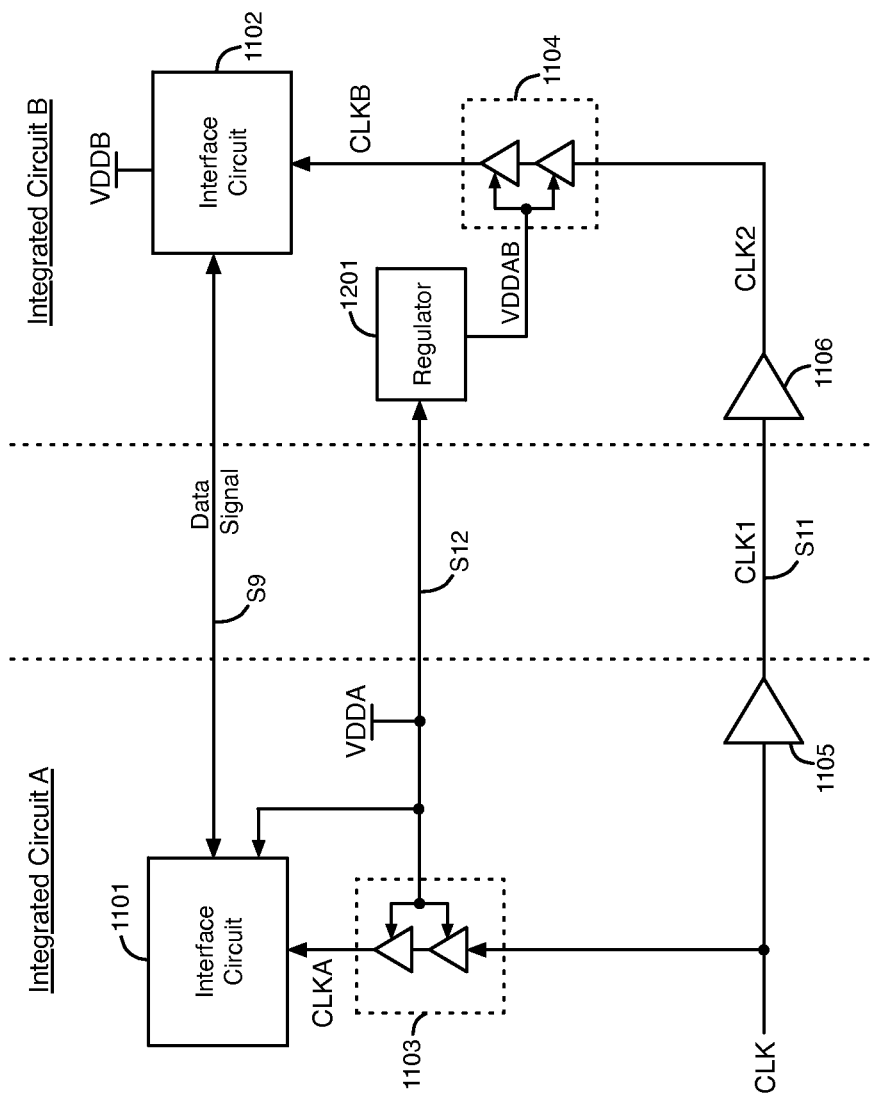
FIG. 12B illustrates another example system having a first integrated circuit that generates a clock signal having power supply induced jitter, which is based on a first supply voltage that is generated using a second supply voltage provided from a second integrated circuit.

FIG. 12B illustrates another example system having a first integrated circuit B that generates a clock signal having power supply induced jitter, which is based on a first supply voltage that is generated using a second supply voltage provided from a second integrated circuit A. Integrated circuit A includes interface circuit 1101, clock network circuit 1103, and clock transmitter circuit 1105. Integrated circuit B includes interface circuit 1102, clock network circuit 1104, clock receiver circuit 1106, and regulator circuit 1201.

In the embodiment of FIG. 12B, supply voltage VDDA is provided from integrated circuit A to regulator circuit 1201 through external conductor S12. Regulator circuit 1201 may be, for example, a DC-DC converter circuit or another type of regulator circuit. Regulator circuit 1201 generates an output supply voltage VDDAB using current that is sourced from supply voltage VDDA. Regulator circuit 1201 generates power supply noise in supply voltage VDDAB that matches the power supply noise in VDDA. Regulator 1201 is selected to have a noise bandwidth that passes most or all of the power supply noise in VDDA to VDDAB within a system power supply noise frequency range of interest. Regulator circuit 1201 may generate a supply voltage VDDAB that is greater than, less than, or equal to supply voltage VDDA.

Supply voltage VDDAB is provided to clock network 1104. One or more of the clock buffer circuits in clock network 1104 that buffer clock signal CLK2 to generate clock signal CLKB draw current that is sourced from supply voltage VDDAB.

In FIG. 12B, the PSIJ that clock network 1104 generates in CLKB based on power supply noise in supply voltage VDDAB substantially matches the PSIJ that clock network 1103 generates in CLKA based on the power supply noise in VDDA. In the system of FIG. 12B, the power supply noise in supply voltages VDDAB and VDDA affects clock signals CLKA and CLKB substantially in-common within a particular power supply noise frequency range. As a result, the impact of any PSIJ in CLKA and CLKB is mitigated, and the ability of interface circuit 1101 or 1102 to capture a data signal having PSIJ on conductor S9 is improved.

Figure 13A:
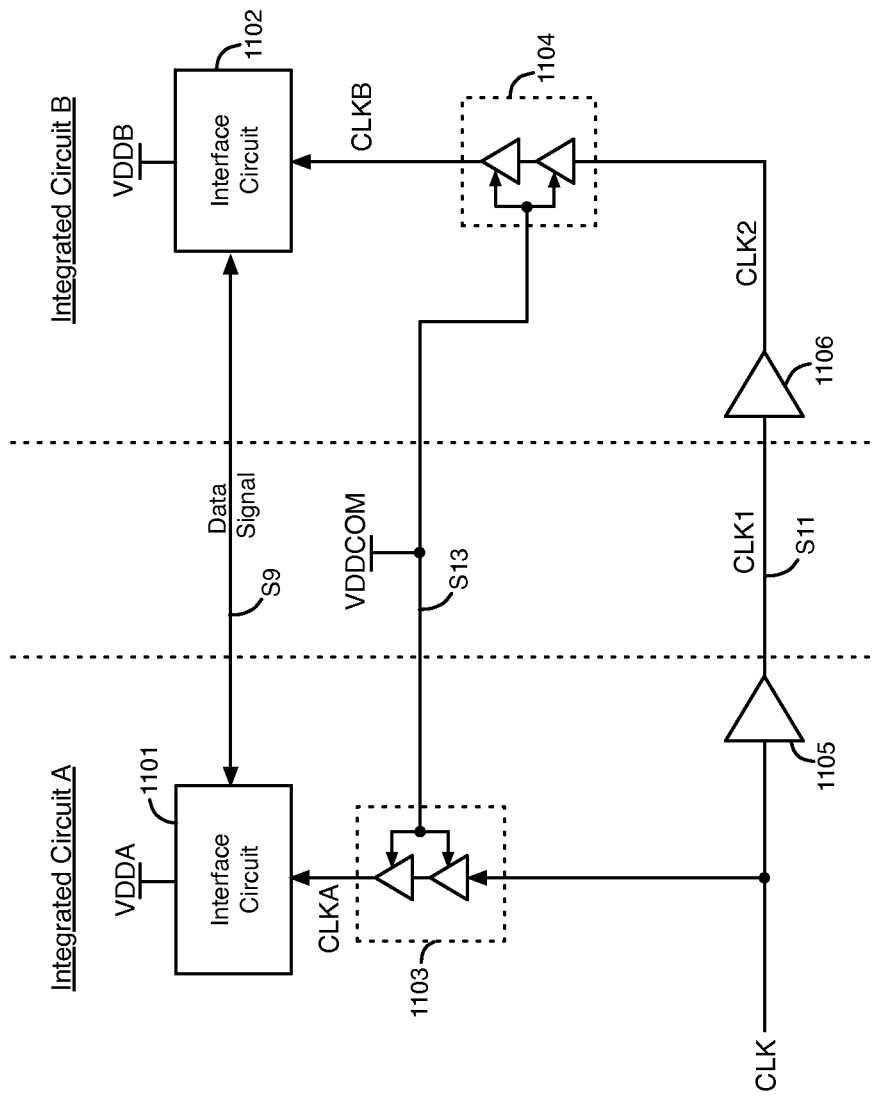
FIG. 13A illustrates an example system having two integrated circuits that each generate a clock signal having power supply induced jitter, which is based on a common supply voltage provided from a source external to both integrated circuits.

FIG. 13A illustrates an example system having two integrated circuits A and B that each generate a clock signal having power supply induced jitter, which is based on a common supply voltage provided from a source external to both integrated circuits. Integrated circuit A includes interface circuit 1101, clock network circuit 1103, and clock transmitter circuit 1105. Integrated circuit B includes interface circuit 1102, clock network circuit 1104, and clock receiver circuit 1106.

Interface circuit 1101 receives supply voltage VDDA, and interface circuit 1102 receives supply voltage VDDB. Supply voltage VDDCOM is generated by a source that is external to integrated circuits A and B. Supply voltage VDDCOM is provided to both of integrated circuits A and B through external conductor S13, as shown in FIG. 13A.

One or more of the clock buffer circuits in clock network 1103 that buffer clock signal CLK to generate clock signal CLKA draw current that is sourced from supply voltage VDDCOM. One or more of the clock buffer circuits in clock network 1104 that buffer clock signal CLK2 to generate clock signal CLKB draw current that is sourced from supply voltage VDDCOM.

If supply voltage VDDCOM has power supply noise, clock network 1103 generates clock signal CLKA having PSIJ that is based on any power supply noise in VDDCOM, and clock network 1104 generates clock signal CLKB having PSIJ that is based on any power supply noise in VDDCOM. In FIG. 13A, the PSIJ that clock network 1104 generates in CLKB based on power supply noise in supply voltage VDDCOM substantially matches the PSIJ that clock network 1103 generates in CLKA based on the power supply noise in VDDCOM. In FIG. 13A, the power supply noise in supply voltage VDDCOM affects clock signals CLKA and CLKB substantially in-common within a particular power supply noise frequency range.

Figure 13B:
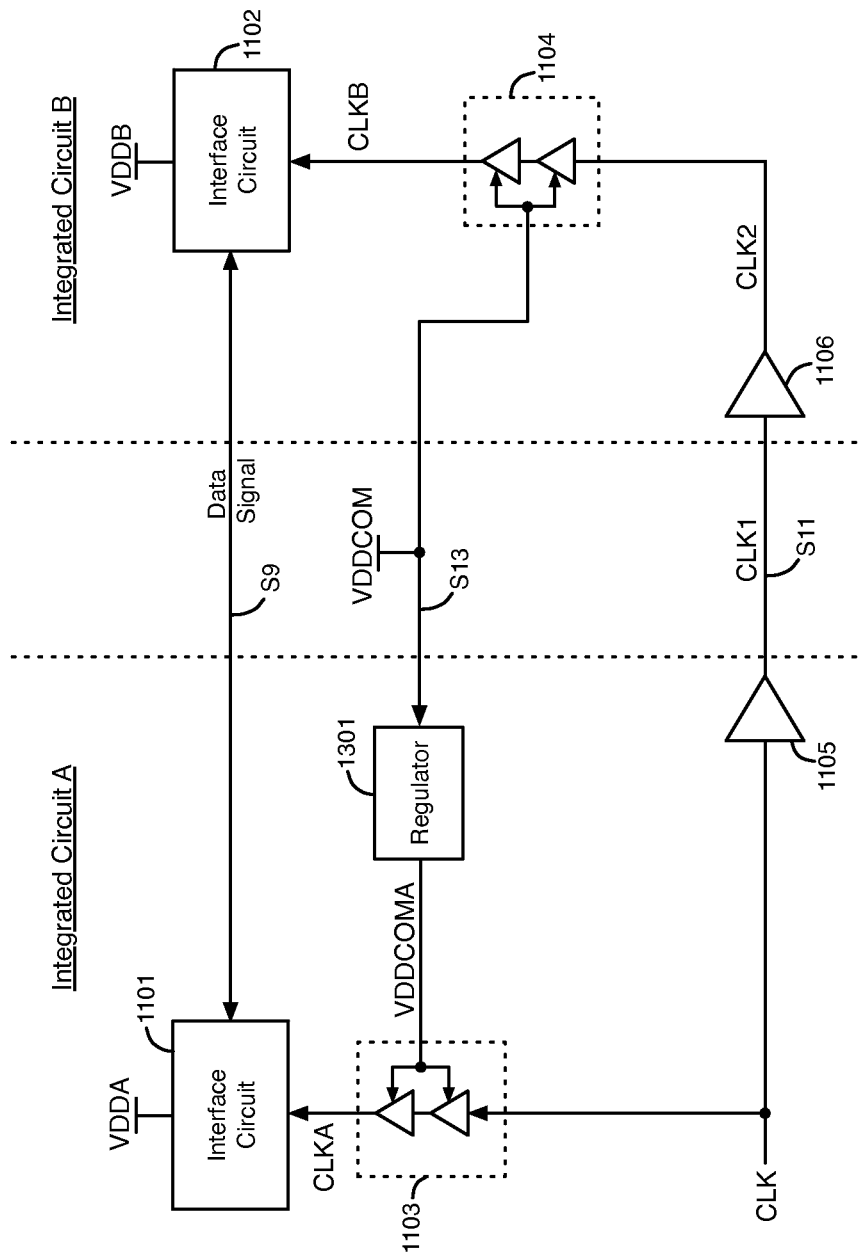
FIG. 13B illustrates an example system having an integrated circuit that generates a clock signal having power supply induced jitter, which is based on a supply voltage that is generated using a supply voltage provided from an external source.

FIG. 13B illustrates an example system having an integrated circuit that generates a clock signal having power supply induced jitter, which is based on a supply voltage that is generated using a supply voltage provided from an external source. The system of FIG. 13B includes integrated circuits A and B. Integrated circuit A includes interface circuit 1101, clock network circuit 1103, clock transmitter circuit 1105, and regulator circuit 1301. Integrated circuit B includes interface circuit 1102, clock network circuit 1104, and clock receiver circuit 1106.

In the embodiment of FIG. 13B, supply voltage VDDCOM is provided to integrated circuits A and B through external conductor S13 from a source external to integrated circuits A and B. VDDCOM is provided to an input of regulator circuit 1301. Regulator circuit 1301 generates an output supply voltage VDDCOMA using current that is sourced from supply voltage VDDCOM. If VDDCOM contains power supply noise, regulator circuit 1301 generates power supply noise in supply voltage VDDCOMA that substantially matches the power supply noise in VDDCOM within a system power supply noise frequency range. Regulator 1301 is selected to have a noise bandwidth that passes most or all of the power supply noise in VDDCOM to VDDCOMA within a system power supply noise frequency range of interest. Regulator circuit 1301 may generate a supply voltage VDDCOMA that is greater than, less than, or equal to supply voltage VDDCOM.

Supply voltage VDDCOMA is provided to clock network 1103. One or more of the clock buffer circuits in clock network 1103 that buffer clock signal CLK to generate clock signal CLKA draw current that is sourced from supply voltage VDDCOMA.

Supply voltage VDDCOM is also provided to clock network 1104. One or more of the clock buffer circuits in clock network 1104 that buffer clock signal CLK2 to generate clock signal CLKB draw current that is sourced from supply voltage VDDCOM.

In FIG. 13B, the PSIJ that clock network 1104 generates in CLKB based on power supply noise in supply voltage VDDCOM substantially matches the PSIJ that clock network 1103 generates in CLKA based on the power supply noise in VDDCOMA. In FIG. 13B, the power supply noise in supply voltages VDDCOM and VDDCOMA affects clock signals CLKA and CLKB substantially in-common within a particular power supply noise frequency range.

Figure 13C:
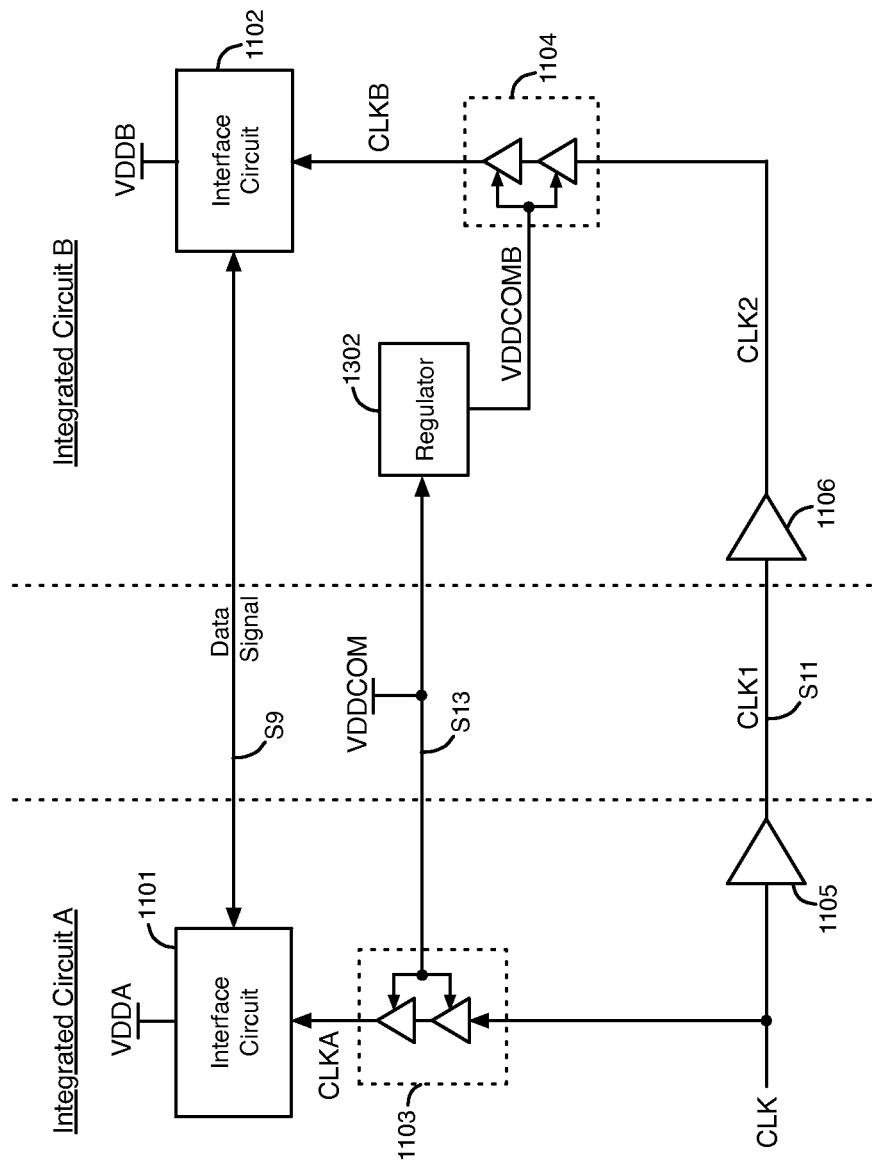
FIG. 13C illustrates another example system having an integrated circuit that generates a clock signal having power supply induced jitter, which is based on a supply voltage that is generated using a supply voltage provided from an external source.

FIG. 13C illustrates another example system having an integrated circuit that generates a clock signal having power supply induced jitter, which is based on a supply voltage that is generated using a supply voltage provided from an external source. The system of FIG. 13C includes integrated circuits A and B. Integrated circuit A includes interface circuit 1101, clock network circuit 1103, and clock transmitter circuit 1105. Integrated circuit B includes interface circuit 1102, clock network circuit 1104, clock receiver circuit 1106, and regulator circuit 1302.

In the embodiment of FIG. 13C, VDDCOM is provided to an input of regulator circuit 1302. Regulator circuit 1302 generates an output supply voltage VDDCOMB using current that is sourced from supply voltage VDDCOM. If VDDCOM contains power supply noise, regulator circuit 1302 generates power supply noise in supply voltage VDDCOMB that matches the power supply noise in VDDCOM. Regulator 1302 is selected to have a noise bandwidth that passes most or all of the power supply noise in VDDCOM to VDDCOMB within a system power supply noise frequency range of interest. Regulator circuit 1302 may generate a supply voltage VDDCOMB that is greater than, less than, or equal to supply voltage VDDCOM.

Supply voltage VDDCOM is provided to clock network 1103. One or more of the clock buffer circuits in clock network 1103 that buffer clock signal CLK to generate clock signal CLKA draw current that is sourced from supply voltage VDDCOM.

Supply voltage VDDCOMB is provided to clock network 1104. One or more of the clock buffer circuits in clock network 1104 that buffer clock signal CLK2 to generate clock signal CLKB draw current that is sourced from supply voltage VDDCOMB.

In FIG. 13C, the PSIJ that clock network 1104 generates in CLKB based on power supply noise in supply voltage VDDCOMB substantially matches the PSIJ that clock network 1103 generates in CLKA based on the power supply noise in VDDCOM. In FIG. 13C, the power supply noise in supply voltages VDDCOM and VDDCOMB affects clock signals CLKA and CLKB substantially in-common within a particular power supply noise frequency range.

Figure 14:
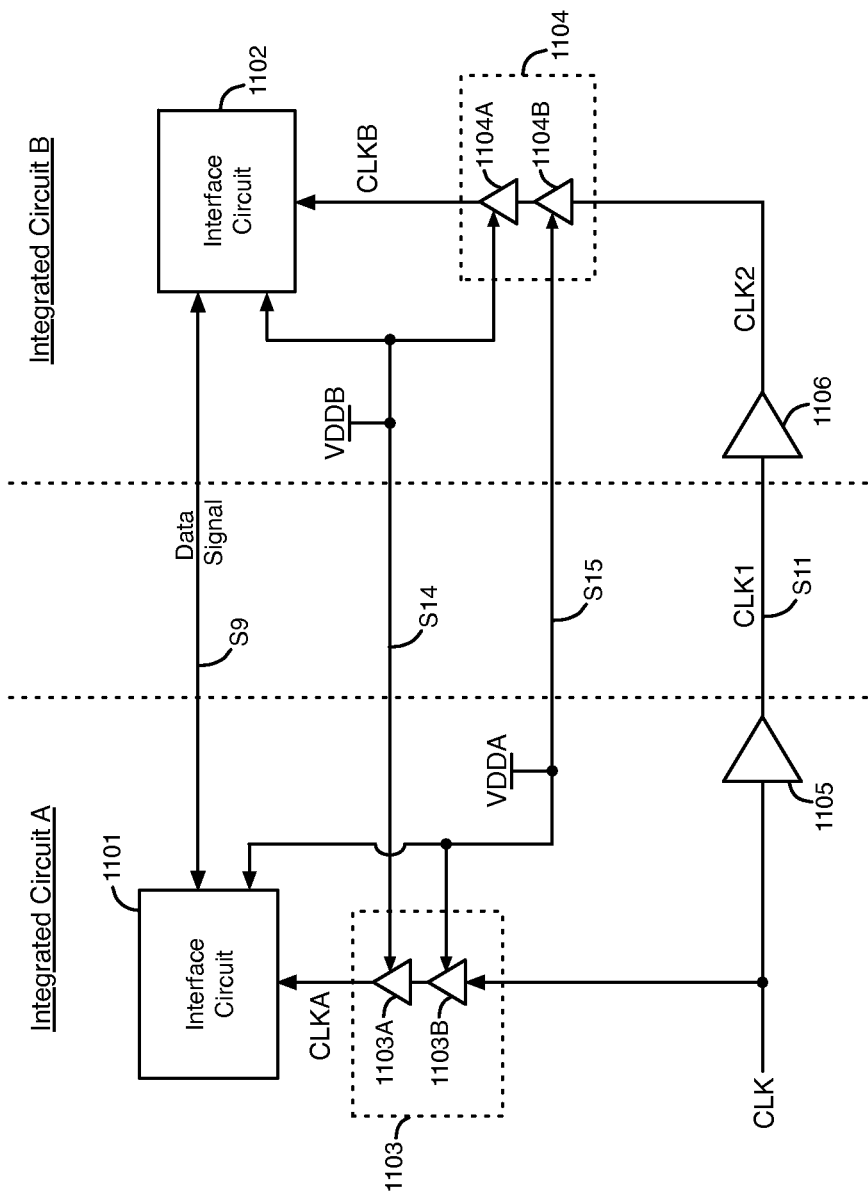
FIG. 14 illustrates an example system having two integrated circuits that each generate a clock signal having PSIJ, which is based on a supply voltage that is provided from the other integrated circuit.

FIG. 14 illustrates an example system having two integrated circuits that each generate a clock signal having PSIJ, which is based on a supply voltage that is provided from the other integrated circuit. The system of FIG. 14 includes integrated circuits A and B. Integrated circuit A includes interface circuit 1101, clock network circuit 1103, and clock transmitter circuit 1105. Integrated circuit B includes interface circuit 1102, clock network circuit 1104, and clock receiver circuit 1106.

Supply voltage VDDA is generated in integrated circuit A or provided to integrated circuit A from an external source. Supply voltage VDDA is provided to a clock buffer circuit 1103B in clock network 1103. Supply voltage VDDA is also provided to integrated circuit B through external conductor S15. Supply voltage VDDA is provided to a clock buffer circuit 1104B in clock network 1104.

Supply voltage VDDB is generated in integrated circuit B or provided to integrated circuit B from an external source. Supply voltage VDDB is provided to a clock buffer circuit 1104A in clock network 1104. Supply voltage VDDB is also provided to integrated circuit A through external conductor S14. Supply voltage VDDB is provided to a clock buffer circuit 1103A in clock network 1103.

Clock buffer circuits 1103A-1103B buffer clock signal CLK to generate clock signal CLKA. Clock buffer circuit 1103A draws current that is sourced from supply voltage VDDB, and clock buffer circuit 1103B draws current that is sourced from supply voltage VDDA. Clock network 1103 adds PSIJ to clock signal CLKA that is based on power supply noise in supply voltages VDDA and VDDB. Clock network 1103 may also have additional clock buffer circuits and other circuitry that are not shown in FIG. 14.

Clock buffer circuits 1104A-1104B buffer clock signal CLK2 to generate clock signal CLKB. Clock buffer circuit 1104A draws current that is sourced from supply voltage VDDB, and clock buffer circuit 1104B draws current that is sourced from supply voltage VDDA. Clock network 1104 adds PSIJ to clock signal CLKB that is based on power supply noise in supply voltages VDDA and VDDB. Clock network 1104 may also have additional clock buffer circuits and other circuitry that are not shown in FIG. 14.

In FIG. 14, the PSIJ that clock network 1104 generates in CLKB based on power supply noise in supply voltages VDDA and VDDB substantially matches the PSIJ that clock network 1103 generates in CLKA based on the power supply noise in VDDA and VDDB. In FIG. 14, the power supply noise in supply voltages VDDA and VDDB affects clock signals CLKA and CLKB substantially in-common within a particular power supply noise frequency range.

Alternative embodiments can be implemented based on the premise that the power supply noise on two integrated circuit devices is substantially shared (within the frequency limits of the transmission) when used for clock buffering and distribution, thus minimizing the system impact of PSIJ by making substantial portions of the jitter in-common between the two integrated circuit devices. Such alternative embodiments can include alternative techniques for clock distribution between the two integrated circuit devices (e.g., using an off-chip clock buffer), etc.

The foregoing description of the exemplary embodiments has been presented for the purposes of illustration and description. The foregoing description is not intended to be exhaustive or limited to the examples disclosed herein. In some instances, certain features of the embodiments can be employed without a corresponding use of other features as set forth. Many modifications, substitutions, and variations are possible in light of the above teachings, without departing from the scope of the claims.

What is claimed is:

1. A system comprising:
   a first integrated circuit chip comprising
      a first internal clock buffer circuit, which draws current that is sourced from a first supply voltage, the first internal clock buffer circuit to provide a first internal clock signal that exhibits first power supply induced jitter (PSIJ) based on the first supply voltage, and
      a first interface circuit to output data synchronously with respect to the first internal clock signal;
   a second integrated circuit chip comprising
      a supply voltage node that receives the first supply voltage from the first integrated circuit chip,
      a second internal clock buffer circuit, which draws current from the supply voltage node that is sourced from the first supply voltage, the second internal clock buffer circuit to generate a second internal clock signal that exhibits second PSIJ based on the first supply voltage, and
      a second interface circuit to receive the data synchronously with respect to the second internal clock signal; and
   wherein the second PSIJ compensates for timing error that is based on the first PSIJ.

2. The system of claim 1, wherein at least one of the first and the second integrated circuit chips further comprises a regulator circuit that generates a second supply voltage using the first supply voltage such that one of the respective first and second internal clock buffer circuits draws current that is sourced from the first supply voltage via the second supply voltage.

3. The system of claim 1 wherein at least one of the first and the second integrated circuit chips draws current from a second supply voltage that is derived from the first supply voltage.

4. The system of claim 1 wherein the first integrated circuit chip further includes a clock receiver circuit, wherein the first internal clock signal is derived from an external timing signal that is received at the clock receiver circuit, and wherein the external timing signal is provided by the second integrated circuit chip.

5. The system of claim 1 wherein the second integrated circuit chip further includes a clock receiver circuit, wherein the second internal clock signal is derived from an external timing signal that is received at the clock receiver circuit, and wherein the external timing signal is provided by the first integrated circuit chip.

6. The system of claim 1 wherein one of the first and the second integrated circuit chips is a memory device and the other of the first and the second integrated circuit chips is a controller device.

7. A first integrated circuit chip comprising:
   a first clock buffer circuit, which draws current that is sourced from a first supply voltage, the first clock buffer circuit to provide a first internal clock signal that exhibits first power supply induced jitter (PSIJ) that is based on the first supply voltage;
   an interface circuit to output data to a second integrated circuit chip, synchronously with respect to the first internal clock signal, wherein the second integrated circuit chip receives the data synchronously with respect to a second internal clock signal and receives the first supply voltage provided by the first integrated circuit, wherein the second internal clock signal exhibits second PSIJ that is based on the first supply voltage and is generated by a second clock buffer circuit, which draws current that is sourced from the first supply voltage; and wherein the second PSIJ compensates for timing error that is based on the first PSIJ.

8. The first integrated circuit chip of claim 7, wherein a delay characteristic of the first clock buffer circuit varies with respect to noise present in the first supply voltage.

9. The first integrated circuit chip of claim 7, wherein the first clock buffer circuit is part of an on chip clock distribution network.

10. The first integrated circuit chip of claim 7, wherein at least one of the first and the second integrated circuit chips further comprises a regulator circuit that generates a second supply voltage using the first supply voltage such that one of the respective first and second clock buffer circuits draws current that is sourced from the first supply voltage via the second supply voltage.

11. The first integrated circuit chip of claim 7, wherein the interface circuit draws current from a second supply voltage that is derived from the first supply voltage.

12. The first integrated circuit chip of claim 7, wherein the first integrated circuit chip further includes a clock receiver circuit, wherein the first internal clock signal is derived from an external timing signal that is received at the clock receiver circuit, and wherein the external timing signal is provided by the second integrated circuit chip.

13. The first integrated circuit chip of claim 7, wherein the second integrated circuit chip further includes a clock receiver circuit, wherein the second internal clock signal is derived from an external timing signal that is received at the clock receiver circuit, and wherein the external timing signal is provided by the first integrated circuit chip.

14. The first integrated circuit chip of claim 7, wherein one of the first and the second integrated circuit chips is a memory device and the other of the first and the second integrated circuit chips is a controller device.

15. A first integrated circuit chip comprising:
a first clock buffer circuit, which draws current that is sourced from a first supply voltage, the first clock buffer circuit to provide a first internal clock signal that exhibits first power supply induced jitter (PSIJ) based on the first supply voltage;
a supply voltage terminal to provide the first supply voltage to a second integrated circuit chip;
an interface circuit to receive data from the second integrated circuit chip, synchronously with respect to the first internal clock signal, wherein the second integrated circuit chip transmits the data to the first integrated circuit chip synchronously with respect to a second internal clock signal that exhibits second power supply induced jitter (PSIJ), wherein the second internal clock signal is generated by a second clock buffer circuit, which draws current that is sourced from the first supply voltage, wherein the second PSIJ is based on the first supply voltage; and
wherein the second PSIJ compensates for timing error that is based on the first PSIJ.

16. The first integrated circuit chip of claim 15, wherein at least one of the first and the second integrated circuit chips further comprises a regulator circuit that generates a second supply voltage using the first supply voltage such that one of the respective first and second clock buffer circuits draws current that is sourced from the first supply voltage via the second supply voltage.

17. The first integrated circuit chip of claim 15, wherein the interface circuit draws current from a second supply voltage that is derived from the first supply voltage.

18. The first integrated circuit chip of claim 15, wherein the first integrated circuit chip further includes a clock receiver circuit, wherein the first internal clock signal is derived from an external timing signal that is received at the clock receiver circuit, and wherein the external timing signal is provided by the second integrated circuit chip.

19. The first integrated circuit chip of claim 15, wherein the second integrated circuit chip further includes a clock receiver circuit, wherein the second internal clock signal is derived from an external timing signal that is received at the clock receiver circuit, and wherein the external timing signal is provided by the first integrated circuit chip.

20. The first integrated circuit chip of claim 15, wherein a delay characteristic of the first clock buffer circuit varies with respect to noise present in the first supply voltage.

21. A method of operation of a first integrated circuit chip, the method comprising:
drawing current in a first clock buffer circuit to provide a first internal clock signal exhibiting first power supply induced jitter (PSIJ), wherein the current is sourced from a first supply voltage and the first PSIJ is based on the first supply voltage;
providing the first supply voltage to a second integrated circuit chip;
receiving data from the second integrated circuit chip, synchronously with respect to the first internal clock signal, wherein the second integrated circuit chip transmits the data to the first integrated circuit chip synchronously with respect to a second clock signal that exhibits second PSIJ, wherein the second clock signal is derived from an external timing signal and is generated by a second clock buffer circuit, which draws current that is sourced from the first supply voltage, the second PSIJ being based on the first supply voltage; and
wherein the second PSIJ compensates for timing error that is based on the first PSIJ.

22. The method of claim 21 further comprising:
generating a second supply voltage using the first supply voltage such that one of the respective first and second clock buffer circuits draws current that is sourced from the first supply voltage via the second supply voltage.

23. The method of claim 21 further comprising:
drawing current in at least one of the first and the second integrated circuit chips from a second supply voltage that is derived from the first supply voltage.

24. The method of claim 21 further comprising:
generating the first internal clock signal from an external timing signal using a clock receiver circuit in the first integrated circuit chip, wherein the external timing signal is provided by the second integrated circuit chip.

25. The method of claim 21 further comprising:
generating the second clock signal from an external timing signal using a clock receiver circuit in the second integrated circuit chip, wherein the external timing signal is provided by the first integrated circuit chip.

26. The method of claim 21 wherein a delay characteristic of the first clock buffer circuit varies with respect to noise present in the first supply voltage.

* * * * *